(12) United States Patent
Park et al.

(10) Patent No.: US 7,605,091 B2
(45) Date of Patent: Oct. 20, 2009

(54) ETCHANT FOR CONDUCTIVE MATERIALS AND METHOD OF MANUFACTURING A THIN FILM TRANSISTOR ARRAY PANEL USING THE SAME

(75) Inventors: Hong-Sick Park, Suwon-si (KR); Sung-Ho Kang, Cheonan-si (KR); Hong-Je Cho, Cheonan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 368 days.

(21) Appl. No.: 11/263,999

(22) Filed: Nov. 2, 2005

(65) Prior Publication Data

US 2006/0094241 A1    May 4, 2006

(30) Foreign Application Priority Data

Nov. 3, 2004    (KR) ...................... 10-2004-0088809

(51) Int. Cl.
*H01L 21/461* (2006.01)
(52) U.S. Cl. .............................. 438/754; 257/E21.582; 216/100; 216/102
(58) Field of Classification Search .................. 438/754; 257/E21.492, E21.582; 216/100, 102, 105, 216/103, 106, 108
See application file for complete search history.

(56) References Cited

U.S. PATENT DOCUMENTS

| | | | | |
|---|---|---|---|---|
| 4,130,455 A * | 12/1978 | Elias et al. | .................. | 216/106 |
| 5,670,062 A | 9/1997 | Lin et al. | | |
| 6,432,755 B2 * | 8/2002 | Sung et al. | .................. | 438/158 |
| 6,433,842 B1 | 8/2002 | Kaneko et al. | | |
| 2002/0045556 A1 * | 4/2002 | Morinaga et al. | ........... | 510/175 |
| 2002/0081847 A1 * | 6/2002 | Jo et al. | ..................... | 438/689 |
| 2003/0207513 A1 * | 11/2003 | Saitou et al. | ................ | 438/200 |
| 2006/0189123 A1 * | 8/2006 | Saitou et al. | ................ | 438/622 |
| 2007/0029280 A1 * | 2/2007 | Lee et al. | ..................... | 216/41 |

FOREIGN PATENT DOCUMENTS

| | | |
|---|---|---|
| JP | 2001-166336 | 6/2001 |
| JP | 2003-043510 | 2/2003 |
| KR | 1020000063024 | 10/2000 |

(Continued)

*Primary Examiner*—Caridad M Everhart
(74) *Attorney, Agent, or Firm*—F. Chau & Associates, LLC

(57) ABSTRACT

The present invention provides a method for manufacturing a thin film transistor (TFT) array panel by forming a gate line having a gate electrode on an insulating substrate; sequentially depositing a gate insulating layer and a semiconductor layer on the gate line; forming a drain electrode and a data line having a source electrode on the gate insulating and semiconductor layers; and forming a pixel electrode connected to the drain electrode. These elements can be formed by photoetching using an etchant containing 65 wt % to 75 wt % of phosphoric acid, 0.5 wt % to 15 wt % of nitric acid, 2 wt % to 15 wt % of acetic acid, 0.1 wt % to 8.0 wt % of a potassium compound, and deionized water. Each element of the TFT array panel can be patterned with the etchant of the invention under similar conditions, which simplifies a manufacturing process and saves costs and results in TFT elements having a good profile.

22 Claims, 42 Drawing Sheets

FOREIGN PATENT DOCUMENTS

| | | |
|---|---|---|
| KR | 1020010003446 | 1/2001 |
| KR | 1020030034402 | 5/2003 |
| KR | 1020030078208 | 10/2003 |
| KR | 1020040029289 | 4/2004 |
| WO | 03036707 | 5/2003 |

* cited by examiner

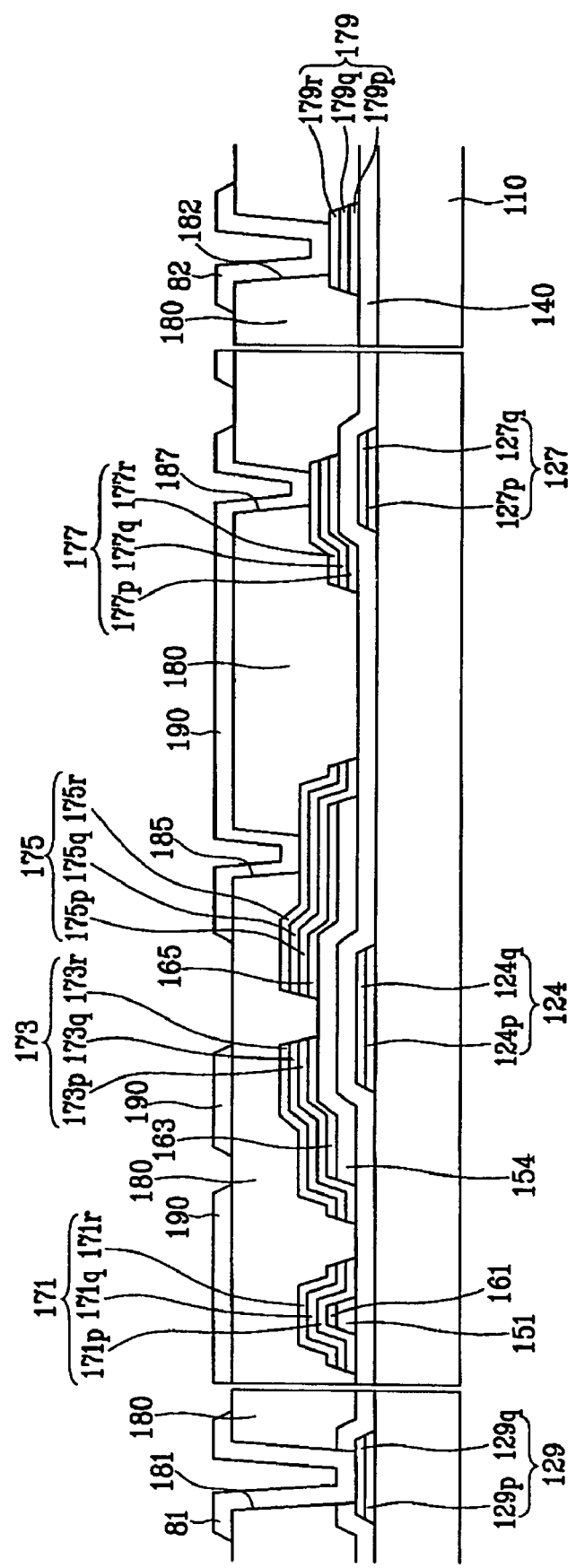

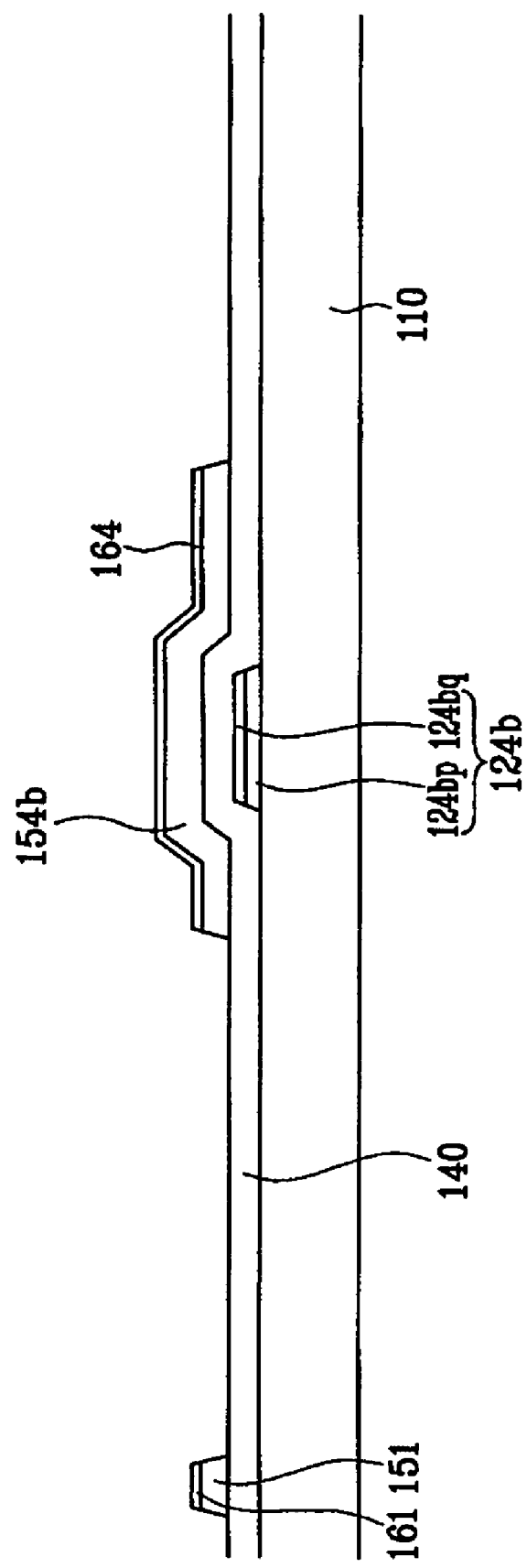

ETCHANT FOR CONDUCTIVE MATERIALS AND METHOD OF MANUFACTURING A THIN FILM TRANSISTOR ARRAY PANEL USING THE SAME

CROSS-REFERENCE TO RELATED APPLICATION

This application claims priority from Korean Patent Application No. 10-2004-0088809 that was filed in the Korean Intellectual Property Office on Nov. 3, 2004, the disclosure of which is incorporated in its entirety by reference herein.

BACKGROUND OF THE INVENTION

1. Field of the Invention

The present disclosure relates to an etchant for conductive materials and a method for manufacturing thin film transistor array panels using the same.

2. Description of the Related Art

Liquid crystal displays (LCDs) are one of the most widely used types of flat panel displays. An LCD includes a liquid crystal (LC) layer interposed between two panels that include field-generating electrodes. The LCD displays images by applying voltages to the field-generating electrodes to generate an electric field in the LC layer, which orients LC molecules in the LC layer to adjust the polarization of incident light.

An LCD arranged such that one panel has a plurality of pixel electrodes in a matrix and the other panel has a common electrode currently dominates the LCD market.

The LCD displays images by applying a different voltage to each pixel electrode. For this purpose, thin film transistors (TFTs), which have three terminals to switch voltages applied to the pixel electrodes, are connected to the pixel electrodes, gate lines that transmit signals for controlling the TFTs, and data lines that transmit voltages applied to the pixel electrodes, are formed on a thin film transistor array panel.

A TFT is a switching element for transmitting image signals from the data lines to the pixel electrodes in response to scanning signals from the gate lines.

The TFT is applied to an active matrix organic light emitting display as a switching element for controlling respective light emitting elements.

Given the increasing size of LCDs, a material having low resistivity is urgently required since the lengths of the gate and data lines also increase along with the LCD size.

Since a metal having low resistivity has weak chemical resistance, however, such a metal is vulnerable to an etchant. Accordingly, signal lines including a plurality of metal layers, at least one of which has low resistivity, often have defective profiles that include undercut and overhang.

Conductor patterns like the gate lines, data lines, and pixel electrodes of a TFT array panel are formed through deposition of conductive materials and photo-etchings. Often, the materials of the conductive patterns are different from each other. Generally, different materials require different etchants and etching conditions. Such variations of etchants and etching conditions complicate the manufacturing process and increase overall manufacturing costs.

SUMMARY OF THE INVENTION

It is an object of the present invention to provide an etchant for conductive materials that produces conductive patterns having a nice profile, simplifies the manufacturing process, and thereby reduces manufacturing costs.

The present invention provides an etchant for conductive materials that contains about 65 wt % to about 75 wt % of phosphoric acid, about 0.5 wt % to about 15 wt % of nitric acid, about 2 wt % to about 15 wt % of acetic acid, about 0.1 wt % to about 8.0 wt % of a potassium compound, and deionized water for the residual quantity.

The present invention provides an alternative etchant wherein the potassium compound includes potassium nitrate ($KNO_3$) and potassium acetate ($KC_2H_3O_2$).

The present invention also provides a method for manufacturing a thin film transistor array panel, including: forming a gate line having a gate electrode on an insulating substrate; depositing in sequence a gate insulating layer, and a semiconductor layer on the gate line; forming a drain electrode on the gate insulating layer and the semiconductor layer; forming a data line having a source electrode on the gate insulating layer and the semiconductor layer such that a gap is disposed between the drain electrode and the source electrode; and forming a pixel electrode connected to the drain electrode, wherein at least one of the gate line, the data line, the drain electrode, and the pixel electrode is formed by photo-etching using an etchant comprising about 65 wt % to about 75 wt % of phosphoric acid, about 0.5 wt % to about 15 wt % of nitric acid, about 2 wt % to about 15 wt % of acetic acid, about 0.1 wt % to about 8.0 wt % of a potassium compound, and deionized water.

BRIEF DESCRIPTION OF THE DRAWINGS

FIG. 2 is a sectional view of the TFT array panel shown in FIG. 1 taken along the line II-II.

FIG. 16A and FIG. 16B are sectional views of the TFT array panel shown in FIG. 15 taken along the lines XVIa-XVIa' and XVIb-XVIb', respectively.

DETAILED DESCRIPTION OF THE PREFERRED EMBODIMENTS

Figure 1:
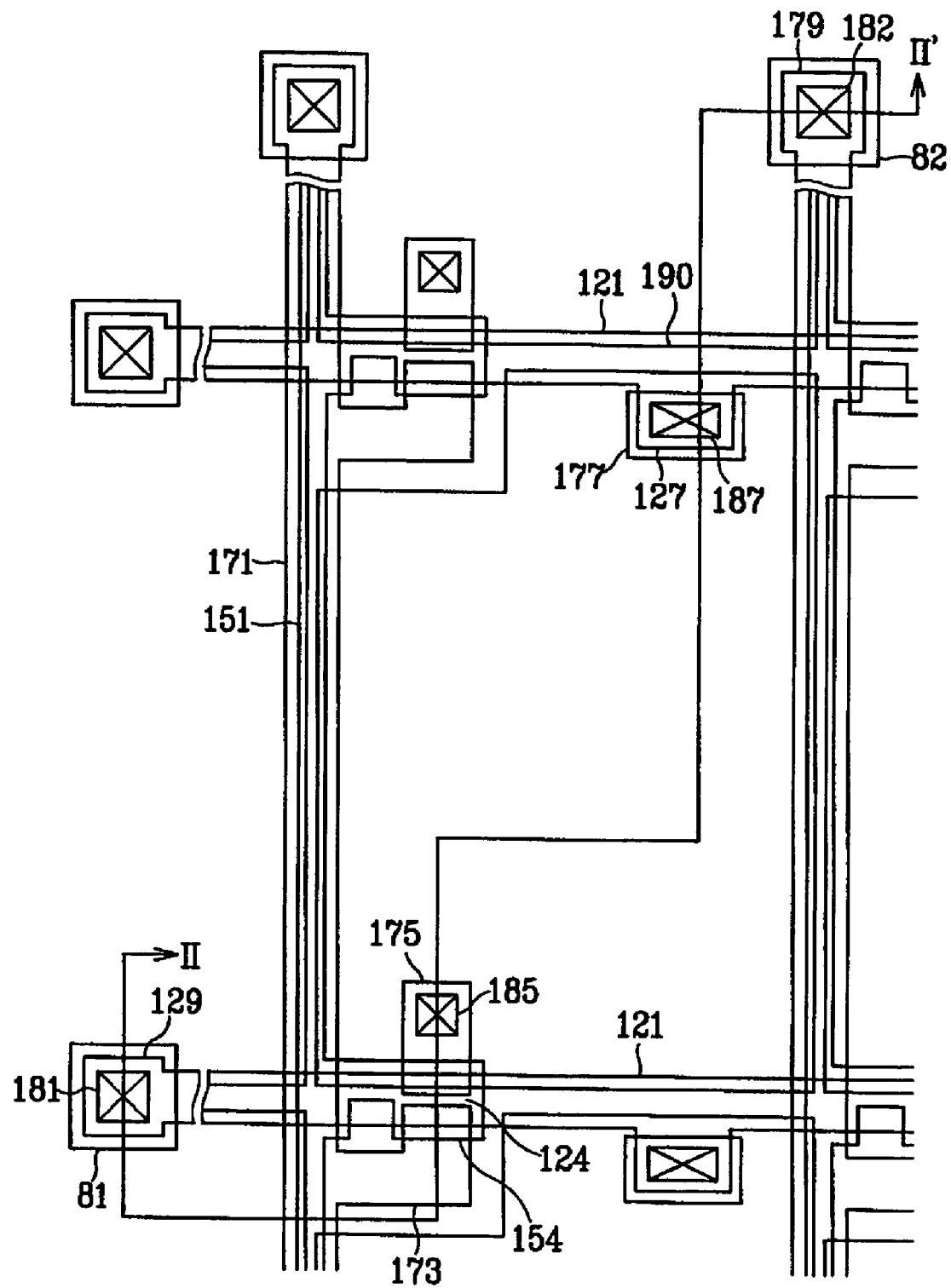
FIG. 1 is a layout view of a TFT array panel for an LCD according to an embodiment of the present invention.

Preferred embodiments of the present invention will now be described more fully hereinafter with reference to the accompanying drawings, in which embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thickness of layers, films, and regions are exaggerated for clarity. Like numerals refer to like elements throughout. The position of elements may be described in reference to their orientation in the figure, e.g. upward being towards the top of the figure. It will be understood that when an element such as a layer, film, region, or substrate is referred to as being "on" another element, it can be directly on the other element or intervening elements may also be present.

Profiles of gate lines, data lines, and pixel electrodes, which are patterned with etchants according to embodiments of the present invention, and etching uniformity of the etchants, are measured.

Six etchants are prepared. Ingredients of the etchants are listed in Table 1.

TABLE 1

| wt % | Phosphoric acid | Nitric acid | Acetic acid | $KNO_3$ | $KC_2H_3O_2$ | $NH_4HS$ | $C_7H_9NO_2$ | Deionized water |
|---|---|---|---|---|---|---|---|---|
| Embodiment 1 | 67 | 6 | 10 | 1 | 1 | — | — | 15 |
| Embodiment 2 | 67 | 6 | 10 | 1 | 1 | 1 | 1 | 13 |
| Embodiment 3 | 73 | 8, 5 | 7 | 2 | 2 | — | — | 7.5 |
| Reference 1 | 63 | 3 | 15.5 | — | — | — | — | 18.5 |
| Reference 2 | 64 | 5 | 10 | — | — | — | — | 21 |
| Reference 3 | 63 | 3 | 10 | 4.5 | 4.5 | 4.5 | 4.5 | 6 |

Six substrates for gate lines were prepared, which had a lower conductive layer of aluminum-neodymium (Al—Nd) and an upper conductive layer of molybdenum nitride (MoN). Six substrates for data lines were also prepared, which had a lower conductive layer of molybdenum niobium (Mo—Nb), a middle conductive layer of aluminum-neodymium (Al—Nd), and an upper conductive layer of Mo—Nb on the middle conductive layer. Finally, six substrates for pixel electrodes were prepared, which had an indium zinc oxide (IZO) layer.

Then, photoresist was coated on the substrates and was illuminated with light through a photo-mask. Next, the illuminated photoresist was developed.

Next, six spray type etch chambers filled with the six etchants of Table 1 were prepared. The etch chambers had an inner temperature of about 30° C. to 45° C. In the present test, all of the etch chambers were set to have a temperature of about 40° C.

In each chamber, three substrates composed of a substrate for gate lines, a substrate for data lines, and a substrate for pixel electrodes were disposed therein for etching the conductive layers. Etching time was adjusted from approximately 30 seconds to 200 seconds. Substrates having the same conductive layer were etched for the same period of time.

After etching, the substrates were cleansed with deionized water and then dried.

Next, after stripping the photoresist, sectional profiles of the etched conductive layers were inspected with a scanning electron microscope (SEM).

The results were as follows.

Conductive layers etched with the etchants of embodiments 1, 2, and 3 had a good side slope and critical dimension (CD) without undercut or overhang. The conductive layers were uniformly etched throughout the whole area of the substrates without inducing stains. The conductive layers etched with the etchant of embodiment 2 showed especially good profiles.

In contrast, conductive layers etched with the etchants of references 1 and 2 resulted in a bad profile having undercut induced by a discrepancy of etch speed between the Al layer and the other conductive layers. The IZO layers showed a notably bad pattern. Furthermore, the conductive layers were not uniformly etched and so produced stains in some portions of the substrates.

Conductive layers etched with the etchant of reference 3 showed a bad profile having recessed Mo layers, opposite to the conductive layers etched with the etchant of references 1 and 2.

Figure 27A:
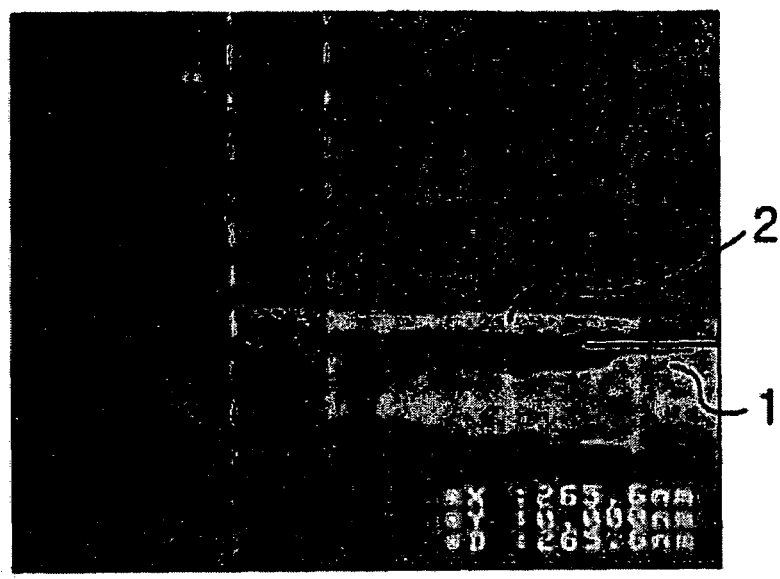
FIG. 27A is a sectional picture of a gate line patterned with the etchant of reference 1.

Looking at FIG. 27A, the gate line patterned with the etchant of reference 1 has an undercut that is formed due to an etch rate discrepancy between the lower conductive layer 1 of Al—Nd and the upper conductive layer 2 of MoN. Since Al—Nd is etched faster than MoN, the lower conductive layer 1 is recessed.

Figure 27B:
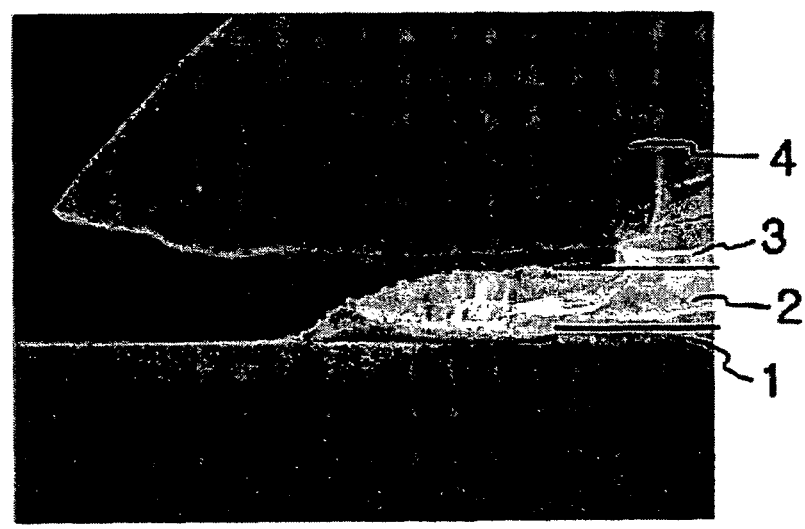
FIG. 27B is a sectional picture of a data line patterned with the etchant of reference 3.

Referring to FIG. 27B, the data line patterned with the etchant of reference 3 has a bad profile that is formed due to a discrepancy of etch speed between the middle conductive layer 2 of Al—Nd and the lower conductive layer 1 and the upper conductive layer 3 of Mo—Nb. (The reference numeral 4 in FIG. 27B represents the photoresist layer). Contrary to reference 1, the etchant of reference 3 etches Mo—Nb faster than the Al—Nd. Accordingly, the lower conductive layer 1 and the upper conductive layer 3 are recessed. Slope angle of the lines and CD skew cannot be measured due to the bad profile. Furthermore, severe stains are generated in all conductive layers.

Figure 28A:
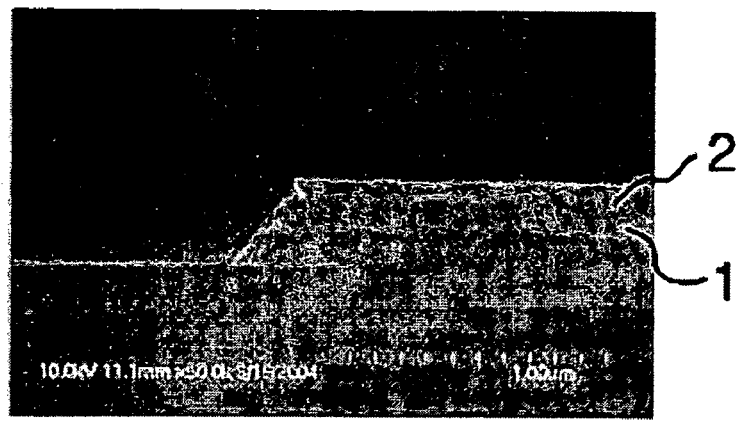
FIG. 28A is a sectional picture of a gate line patterned with the etchant of embodiment 2.
Figure 28B:
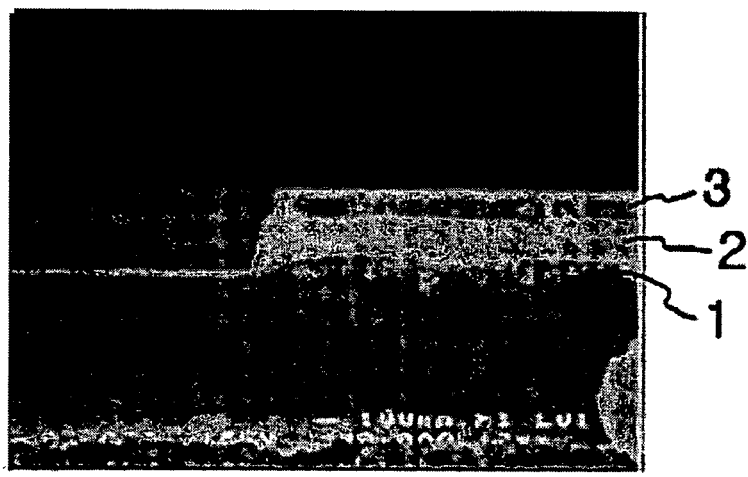
FIG. 28B is a sectional picture of a data line patterned with the etchant of embodiment 2.
Figure 28C:
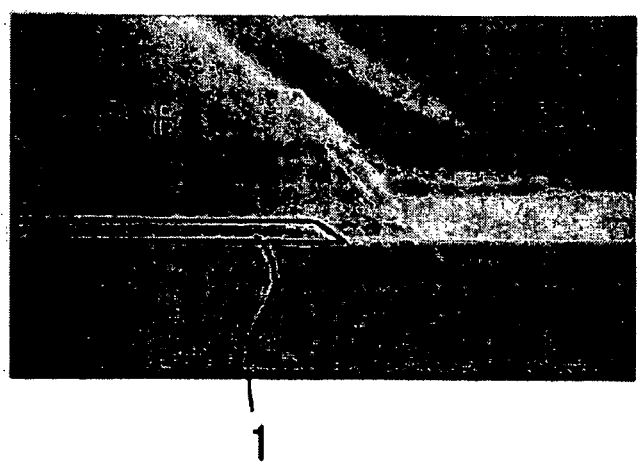
FIG. 28C is a sectional picture of a pixel electrode patterned with the etchant of embodiment 2.

On the other hand, referring to FIGS. 28A, 28B, and 28C, all conductive layers (gate lines, data lines, and pixel electrodes) etched with the etchant of embodiment 2 have a good side slope and critical dimension (CD) without undercut or overhang. In particular, the gate line of double layers (FIG. 28A) and the data line of triple layers (FIG. 28B) do not suffer a profile degradation that may occur when there is an etch rate discrepancy between a lower layer and an upper layer. Furthermore, the etchant of embodiment 2 etches the pixel electrode material as well as the materials of the gate line and the data line. Precisely, the gate line and the data line have side slopes of an angle between 60 degrees and 80 degrees and have a CD skew from about 1.0 μm to 1.5 μm. The pixel electrode has side slopes of an angle about 50 degrees and has a CD skew of from about 0.2 μm to 0.3 μm. The etchant of embodiment 2 uniformly etches the conductive layers throughout the whole area of the substrates without inducing stains.

As described above, an etchant according to an embodiment of the present invention further contains a potassium compound and/or a basic nitrogen compound along with phosphoric acid, nitric acid, and acetic acid to stabilize the profile of the conductive layers and to enhance etching uniformity.

In general, a conductor having two or more layers suffers profile degradation due to etch rate discrepancy. Double layer or triple layer conductive layers including a Mo layer and an Al layer may suffer serious profile degradation due to a galvanic effect. The galvanic effect exists when oxidation and reduction results in metals having different electrical potentials are disposed in an electrolyte solution. A metal having a relatively positive potential works as a cathode and tends to be reduced, while the other metal having a relatively negative potential works as an anode and tends to be oxidized. The galvanic effect reduces the etching rate (eroding is speed) of the cathode metal and increases the etching speed of the anode metal. Accordingly, the Al layer of multi-metal layers, including an Al layer and a Mo layer, which works as an anode, is etched much faster than the Mo layer, which acts as a cathode.

An etchant according to an embodiment of the present invention further contains a potassium compound and/or a basic nitrogen compound along with phosphoric acid, nitric acid, and acetic acid to reduce the galvanic effect.

A potassium compound and a basic nitrogen compound reduce the galvanic effect by restraining migration of electrons between different metals. However, when an etchant contains too much of the potassium compound or the basic nitrogen compound, the galvanic effect may be over-restrained and induce a reversal of etching rate. Accordingly, the proportion of the potassium compound and the basic nitrogen compound is required to be adjusted for an appropriate galvanic effect.

An etchant according to the present invention preferably contains about 0.1 wt % to 8 wt % of the potassium compound and/or the basic nitrogen compound. When an etchant contains less than 0.1 wt % of the potassium compound and/or the basic nitrogen compound the effect of restraining the galvanic effect is not shown, much like in the etchant of reference 1. When an etchant contains more than 8 wt % of the potassium compound and/or the basic nitrogen compound the galvanic effect may be over-restrained and induce a reversal of etching rate as described above. Such an etchant etches the Mo layer faster than the Al layer, like in the etchant of reference 3, and induces profile degradation.

When a conductive layer on a large size substrate is patterned with a conventional etchant, the conductive layer is irregularly etched due to an etch rate discrepancy between a center portion and edge portions.

An etchant according to an embodiment of the present invention further contains a potassium compound and/or a basic nitrogen compound along with phosphoric acid, nitric acid, and acetic acid to reform surface conditions of the target layer. Accordingly, etching is uniformly performed on the whole area. This effect can be seen in FIG. 27A through FIG. 28C.

An etchant according to the present invention can be applied to conductive layers like pattern gate lines, data lines, and pixel electrodes regardless of the number of layers. All conductive layers etched with an etchant of the present invention have a good profile. Accordingly, costs are reduced and the manufacturing process is simplified, which thereby increases production efficiency. Furthermore, an etchant according to the present invention uniformly etches conductive layers throughout the whole area without inducing stains, which enhances product quality.

In the above descriptions, Al—Nd, MoN, Mo—Nb, and IZO are exemplified for the test. However, an etchant according to the present invention may etch materials including Al or Mo, as well as indium tin oxide (ITO). As known to persons of ordinary skill in the art, an etchant according to the present invention could be used to etch other conductive materials.

Now, a TFT array panel and a manufacturing method thereof using the etchant of embodiment 2 will be described in detail with reference to the accompanying drawings.

As shown in FIG. 1 and FIG. 2, a plurality of gate lines 121 for transmitting gate signals are formed on an insulating substrate 110. Gate lines 121 are mainly formed in the horizontal direction and partial portions thereof become a plurality of gate electrodes 124. Also, gate lines 121 include portions that extend in a lower direction that become a plurality of expansions 127. An end portion 129 of gate line 121 has an expanded width for connecting with an external device such as a driving circuit.

Gate line 121 has lower layers 124p, 127p, and 129p and upper layers 124q, 127q, and 129q. Lower layers 124p, 127p, and 129p can be made of materials such as aluminum (Al) or aluminum-neodymium (Al—Nd). Upper layers 124q, 127q, and 129q can be made of materials such as molybdenum (Mo) or MoN.

The lateral sides of upper layers 124q, 127q, and 129q and lower layers 124q, 127q, and 129q are inclined relative to a surface of the substrate 110, and the inclination angle thereof ranges from about 30 degrees to 80 degrees.

A gate insulating layer 140 preferably made of silicon nitride (SiNx) can be formed on gate lines 121.

A plurality of semiconductor stripes 151, preferably made of hydrogenated amorphous silicon (abbreviated to "a-Si"), can be formed on gate insulating layer 140. Each semiconductor stripe 151 extends substantially in the longitudinal direction and has a plurality of projections 154 branched out towards gate electrodes 124. The width of each semiconductor stripe 151 becomes large near the gate lines 121 to cover large areas thereof.

A plurality of ohmic contact stripes 161 and islands 165, preferably made of silicide or n+ hydrogenated a-Si heavily doped with n-type impurity, can be formed on the semiconductor stripes 151. Each ohmic contact stripe 161 has a plurality of projections 163 formed in pairs with ohmic contact islands 165 on projections 154 of the semiconductor stripes 151.

The edge surfaces of semiconductor stripes 151 and ohmic contacts 161 and 165 are tapered at angles preferably in a range from about 30 degrees to 80 degrees.

A plurality of data lines 171, a plurality of drain electrodes 175, and a plurality of storage capacitor conductors 177 are formed on ohmic contacts 161 and 165 and gate insulating layer 140.

Data lines 171, for transmitting data voltages, extend substantially in the longitudinal direction and cross gate lines 121 to define the pixel areas arranged in a matrix. Data lines 171 have a plurality of branches, which project toward respective drain electrodes 175, that form a plurality of source electrodes 173. Data lines 171 further have an end portion 179 of an enlarged width. Each pair of the source electrodes 173 and the drain electrodes 175 are separated from each other over the gate electrodes 124 to thereby oppose one another.

Data line 171, drain electrode 175, and storage capacitor conductor 177 may comprise first layers 171p, 175p, and 177p, second layers 171q, 175q, and 177q, and third layers 171r, 175r, and 177r. The first layers 171p, 175p, and 177p and the third layers 171r, 175r, and 177r are disposed at lower and upper sides, respectively, of the second layers 171q, 175q, and 177q. The first layers 171p, 175p, and 177p and the third layers 171r, 175r, and 177r can be made of material including Mo, such as Mo itself or Mo—Nb. The second layers 171q, 175q, and 177q can be made of material including Al, such as Al itself or Al—Nd. Since the Al or Al-alloy layer, having low resistivity, is disposed between the two Mo-alloy layers, data line 171 has a low resistivity and the Al or Al-alloy layer is prevented from contacting the semiconductor and the pixel electrodes, which may cause a bad contact. Accordingly, degrading of TFTs caused by bad contact is efficiently prevented.

Gate electrode 124, source electrode 173, and drain electrode 175, along with projection 154 of semiconductor stripe 151, forms a TFT having a channel formed in the projection 154 disposed between the source electrode 173 and the drain electrode 175. A portion of storage capacitor conductor 177 may overlap expansion 127 of gate line 121.

Data lines 171, drain electrodes 175, and the storage capacitor conductor 177 have edge surfaces that are tapered at an angle in a range from about 30 degrees to 80 degrees.

Ohmic contacts 161 and 165 are only interposed between semiconductor stripe 151 and data line 171 as well as between drain electrode 175 and semiconductor stripe projection 154 in order to reduce contact resistance therebetween.

Semiconductor stripe 151 is partially exposed at an area between source electrode 173 and drain electrode 175, and at other areas not covered by data line 171 or drain electrode 175. Most of semiconductor stripe 151 is narrower than data line 171, but semiconductor stripe 151 broadens near the area where semiconductor stripe 151 crosses gate line 121 to prevent disconnection of data line 171.

A passivation layer 180 is provided on data line 171, drain electrode 175, storage capacitor conductor 177, and the exposed region of semiconductor stripe 151. Passivation layer 180 can be made of an organic material having substantial planarization properties and photosensibility or can be made if an insulating material with a low dielectric constant such as a-Si:C:O or a Si:O:F, for example. Passivation layer 180 may be formed by plasma enhanced chemical vapor deposition (PECVD). Passivation layer 180 can be structured in a way that an insulating layer made of SiNx or $SiO_2$ is additionally formed under the organic material layer to prevent the organic material of passivation layer 180 from contacting portions of semiconductor stripes 151 exposed between data line 171 and drain electrode 175.

A plurality of contact holes 181, 185, 187, and 182 are formed in passivation layer 180 to expose an end portion 129 of gate line 121, drain electrode 175, storage capacitor conductor 177, and an end portion 179 of data line 171, respectively.

A plurality of pixel electrodes 190 and a plurality of contact assistants 81 and 82, which can be made of IZO or ITO, may be formed on passivation layer 180.

Since pixel electrode 190 is physically and electrically connected to drain electrode 175 and storage capacitor conductor 177 through respective contact holes 185 and 187, pixel electrode 190 receives the data voltage from drain electrode 175 and transmits it to the storage capacitor conductor 177.

Pixel electrode 190, to which the data voltage is applied, generates an electric field with a common electrode (not illustrated) of the opposite panel (not illustrated), to which a common voltage is applied, to orient LC molecules in the LC layer to change the polarization of incident light.

Also, pixel electrode 190 and the common electrode form a capacitor to store a voltage after the TFT is turned off. This capacitor will be referred to as an "LC capacitor." To enhance the voltage storage ability, another capacitor is provided, which is connected with the LC capacitor in parallel and will be referred to as a "storage capacitor." The storage capacitor is formed at an overlapping portion of the pixel electrode 190 and the adjacent gate line 121, which will be referred to as a "previous gate line." Gate line expansion 127 is provided to ensure the largest possible overlap dimension and, thus, increase the storage capacity of the storage capacitor. Storage capacitor conductor 177 is connected to pixel electrode 190 and overlaps expansion 127, and is provided at the bottom of passivation layer 180 so that pixel electrode 190 becomes close to the previous gate line 121.

Optional contact assistants 81 and 82 may be respectively connected to gate line end portion 129 and data line end portion 179, respectively. Contact assistants 81 and 82 supplement adhesion between end portions 129 and 171 and exterior devices, such as the driving integrated circuit, and protects them.

A method of manufacturing a TFT array panel will now be described in detail with reference to FIG. 3A through FIG. 6B, as well as FIG. 1 and FIG. 2.

Figure 3A:
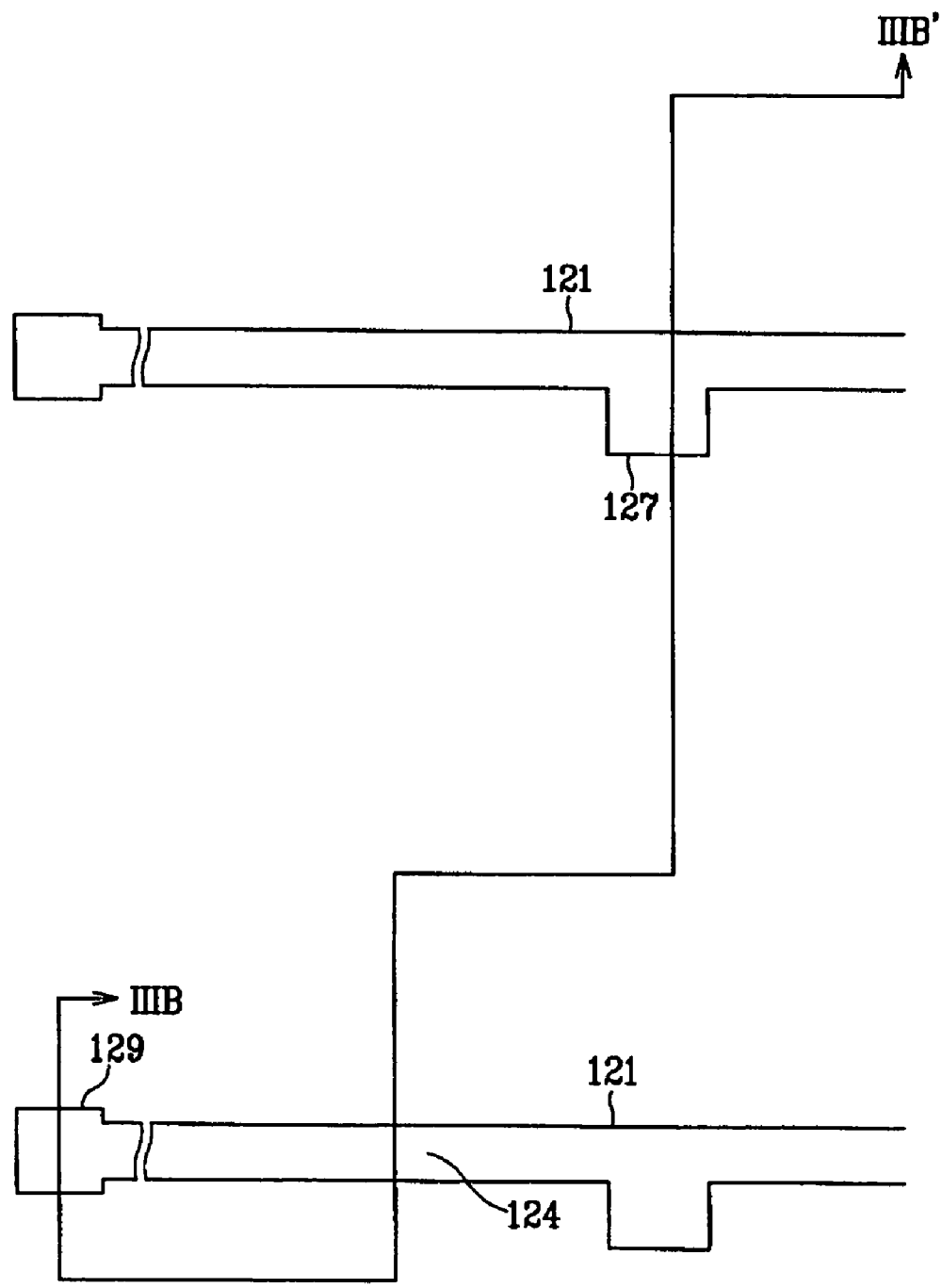
FIG. 3A, FIG. 4A, FIG. 5A, and FIG. 6A are layout views sequentially illustrating the intermediate steps of a method of manufacturing a TFT array panel for an LCD shown in FIG. 1 and FIG. 2.
Figure 3B:
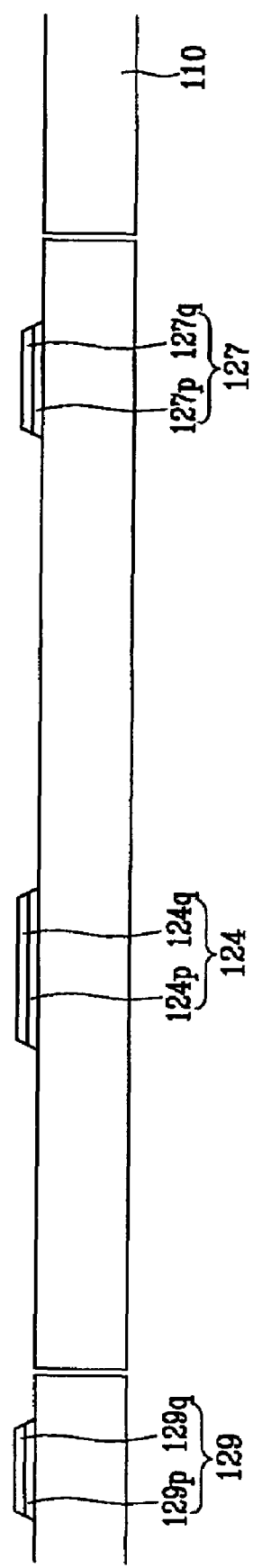
FIG. 3B is a sectional view of the TFT array panel shown in FIG. 3A taken along the line IIIb-IIIb'.

At first, as shown in FIG. 3A and FIG. 3B, metal layers are formed on an insulating substrate 110.

The metal layer is deposited by a Co-sputtering. Two targets are installed in a same sputtering chamber for the Co-sputtering. One target can be made of Al—Nd. The other target can be made of Mo. Here, the Al—Nd target preferably contains 2 wt % of Nd.

The Co-sputtering is performed as follows.

At first, power is applied to the Al—Nd target while no power is applied to the Mo target to deposit a lower layer of Al—Nd. The thickness of the lower layer is preferably 2,500 Å but may be varied from approximately 1,000 Å to 5,000 Å

Next, power is applied to the Mo target and not applied to the Al—Nd target to deposit an upper layer. The thickness of the upper layer is preferably 1,000 Å but may be varied from approximately 50 Å to 2,000 Å

Then, photoresist is coated on the upper layer and is illuminated with a light through a photo-mask to develop the photoresist.

The upper and lower layers are simultaneously etched to form a plurality of gate lines 121. The etching is performed at a temperature between about 35° C. and 45° C. for approximately 30 seconds to 200 seconds by spraying an etchant on the substrate.

The proportions of the etchant components may be varied in approximate ranges of 65 wt % to 75 wt % of phosphoric acid, 0.5 wt % to 15 wt % of nitric acid, 2 wt % to 15 wt % of acetic acid, 0.1 wt % to 8.0 wt % of a potassium compound, and water for the residual quantity. As previously noted, when 0.1 wt % to 8.0 wt % of a basic nitrogen compound is added to the etchant, conductive layers may have a better profile when etched.

When the gate line is patterned with such an etchant, the gate line has a nice profile because the galvanic effect is reduced and etching uniformity is enhanced over the whole substrate due to surface reforming.

Through the above described processes, as shown in FIG. 3A and FIG. 3B, a plurality of gate lines 121 having a plurality of gate electrodes 124, expansions 127, and end portions 129 are formed.

Figure 4A:
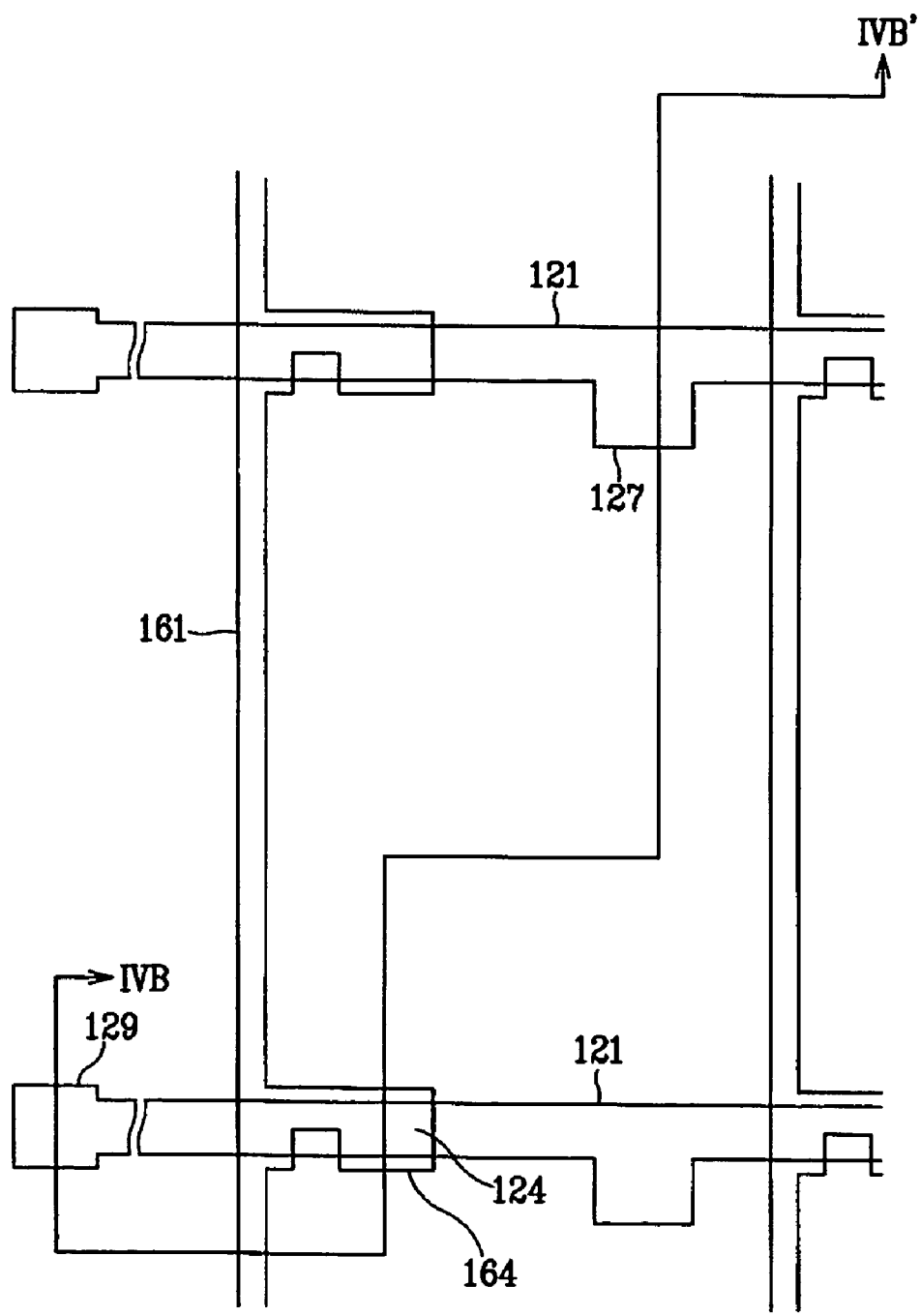
Figure 4B:
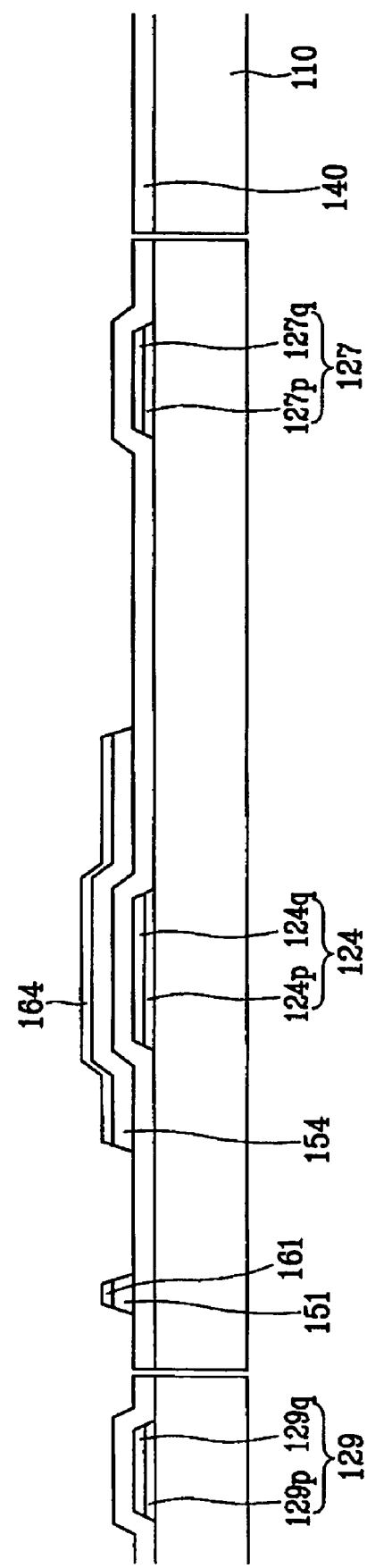
FIG. 4B is a sectional view of the TFT array panel shown in FIG. 4A taken along the line IVb-IVb' in the step following the step shown in FIG. 3B.

Referring to FIG. 4A and FIG. 4B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 161 and a plurality of intrinsic semiconductor stripes 151 having respective projections 164 and 154. Gate insulating layer 140 is preferably made of silicon nitride with a thickness of about 2,000 Å to about 5,000 Å, and the deposition temperature is preferably in a range from about 250° C. to 500° C.

Next, a first layer of Mo—Nb, a second layer of Al—Nd, and a third layer of Mo—Nb can be sequentially deposited on extrinsic semiconductor stripes 161. The thickness of the first layer is preferably in a range from about 50 Å to 2,000 Å. The second layer is preferably between about 1,000 Å and 5,000 Å. The thickness of the third layer is preferably between about 50 Å and 2,000 Å. The sputtering temperature is preferably about 150° C.

Then, photoresist is coated on the third layer and is illuminated with a light through a photo-mask to develop the photoresist.

The first layer, the second layer, and the third layer are simultaneously etched with the etchant of embodiment 2 to form a plurality of data lines 171 and drain electrodes 175.

The etching is performed at a temperature between about 35° C. and 45° C. for about 30 seconds to 200 seconds by spraying an etchant on the substrate.

As noted before, the data line patterned using such an etchant has a nice profile because the galvanic effect is reduced and etching uniformity is enhanced over the whole substrate due to surface reforming.

Figure 5A:
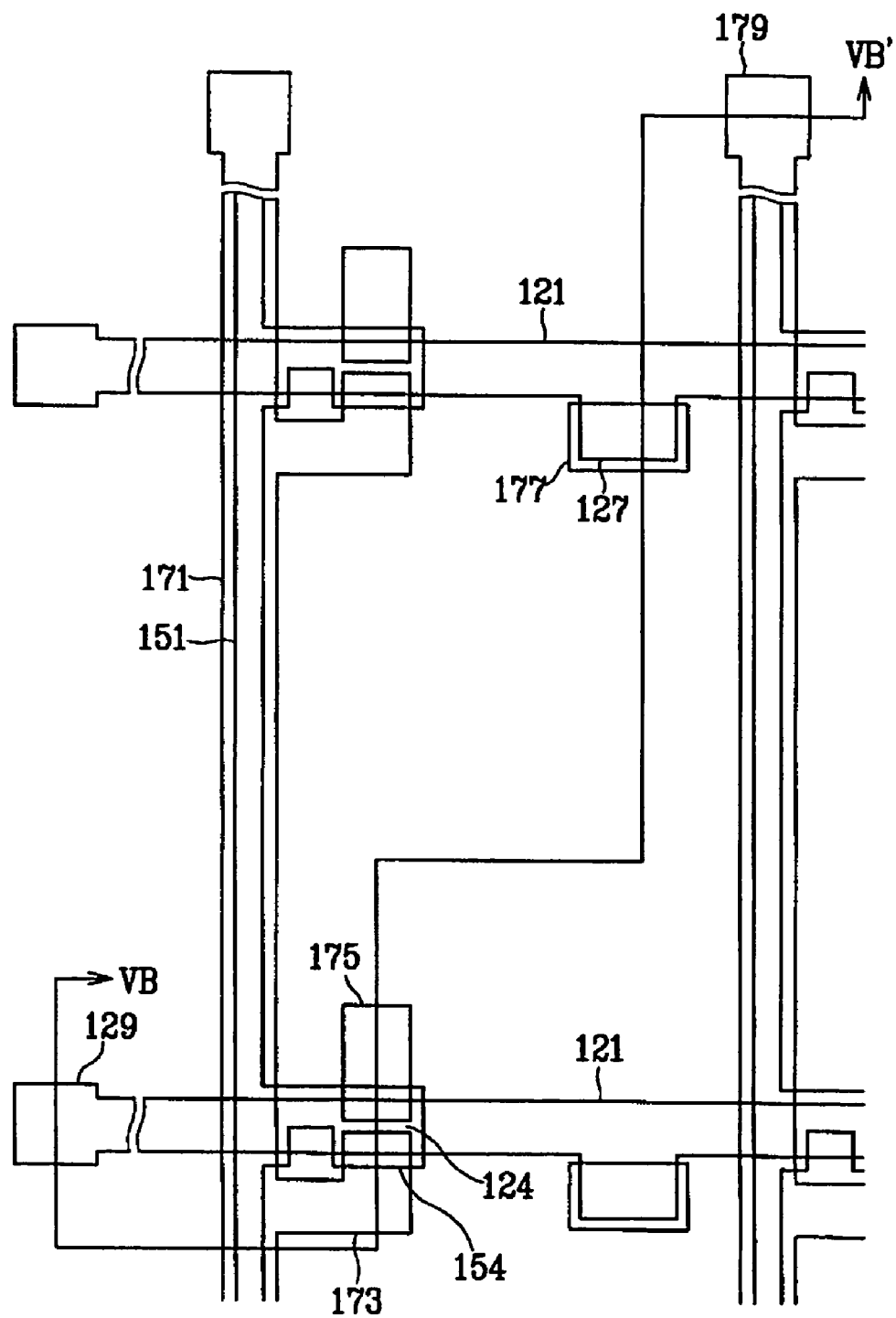
Figure 5B:
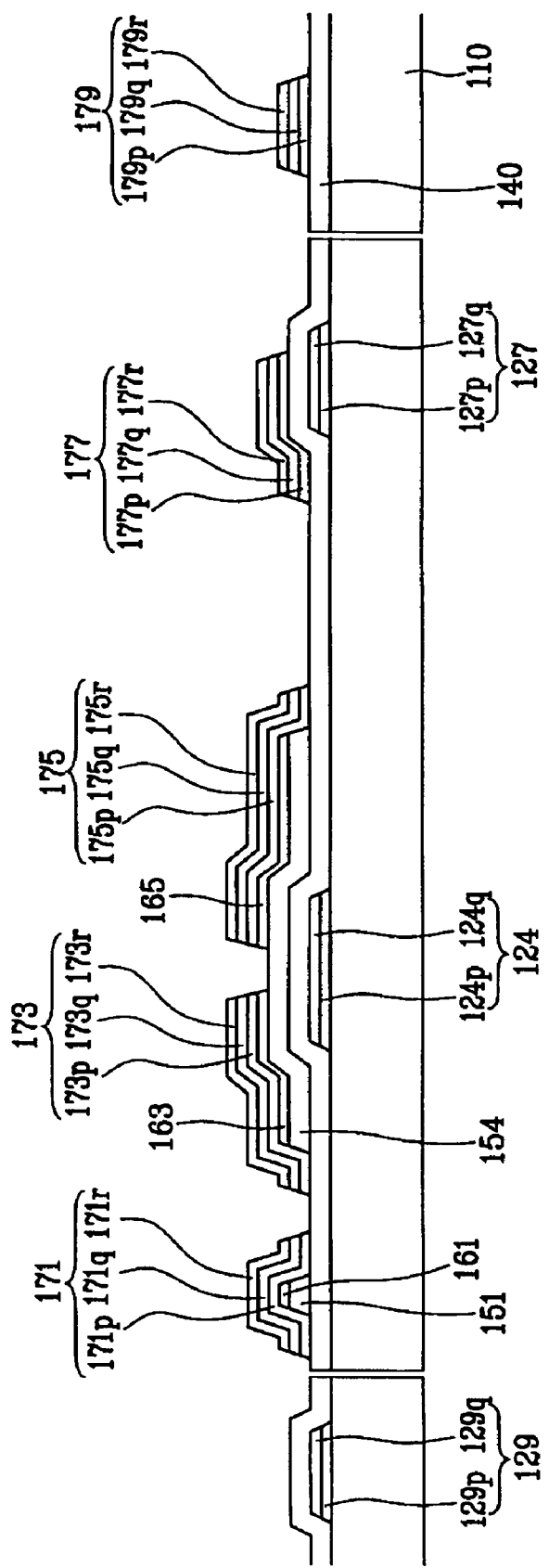
FIG. 5B is a sectional view of the TFT array panel shown in FIG. 5A taken along the line Vb-Vb' in the step following the step shown in FIG. 4B.

Through the above described processes, as shown in FIG. 5A and FIG. 5B, a plurality of data lines 171 having a plurality of source electrodes 173, a plurality of drain electrodes 175, end portions 179, and storage capacitor conductors 177 are formed.

Next, portions of the extrinsic semiconductor stripes 161, which are not covered by the data lines 171 or drain electrodes 175, are removed by etching to complete a plurality of ohmic contacts 163 and 165 and to expose portions of intrinsic semiconductor stripes 151. Oxygen plasma treatment may follow thereafter in order to stabilize the exposed surfaces of semiconductor stripes 151.

Figure 6A:
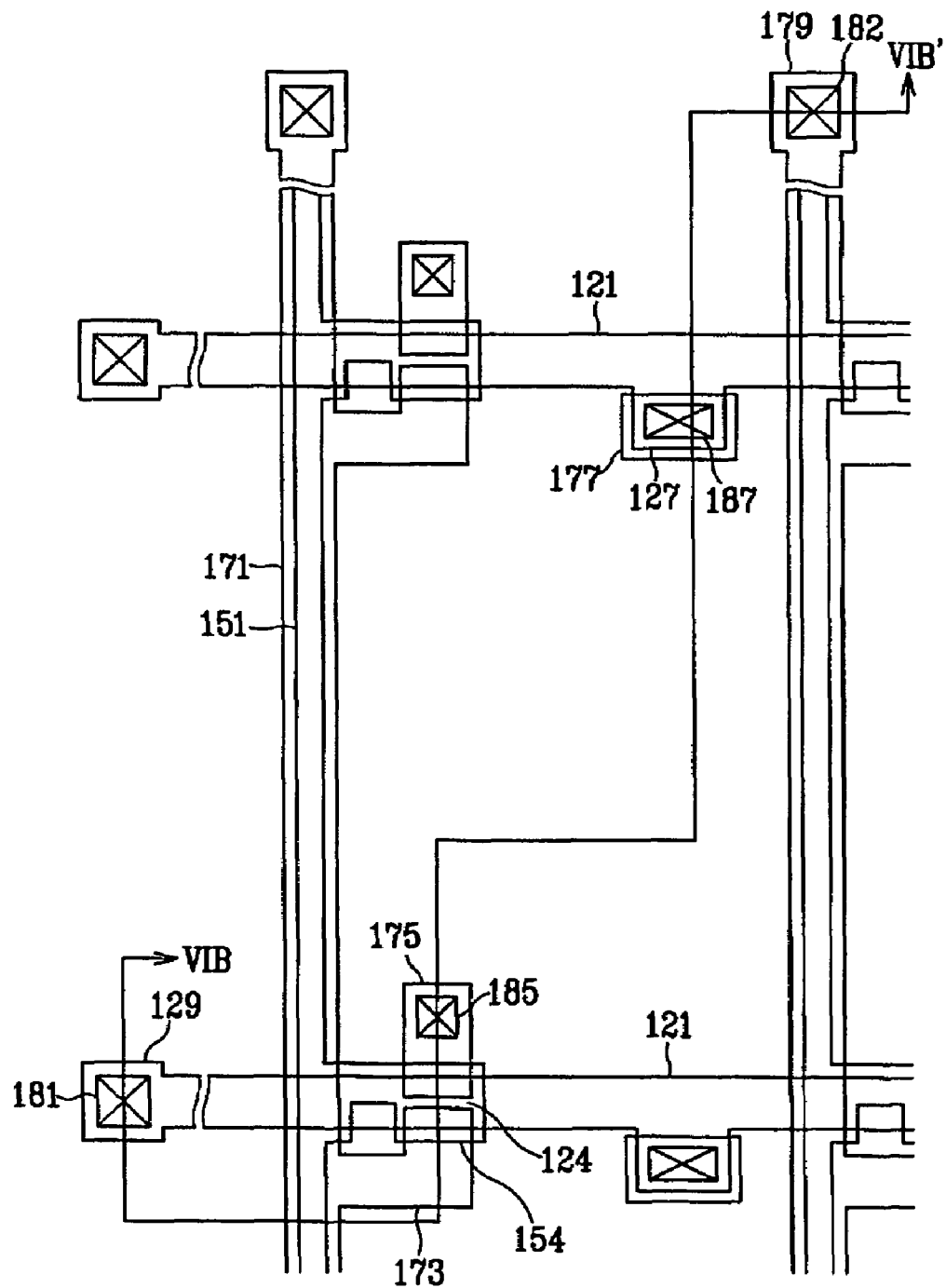
Figure 6B:
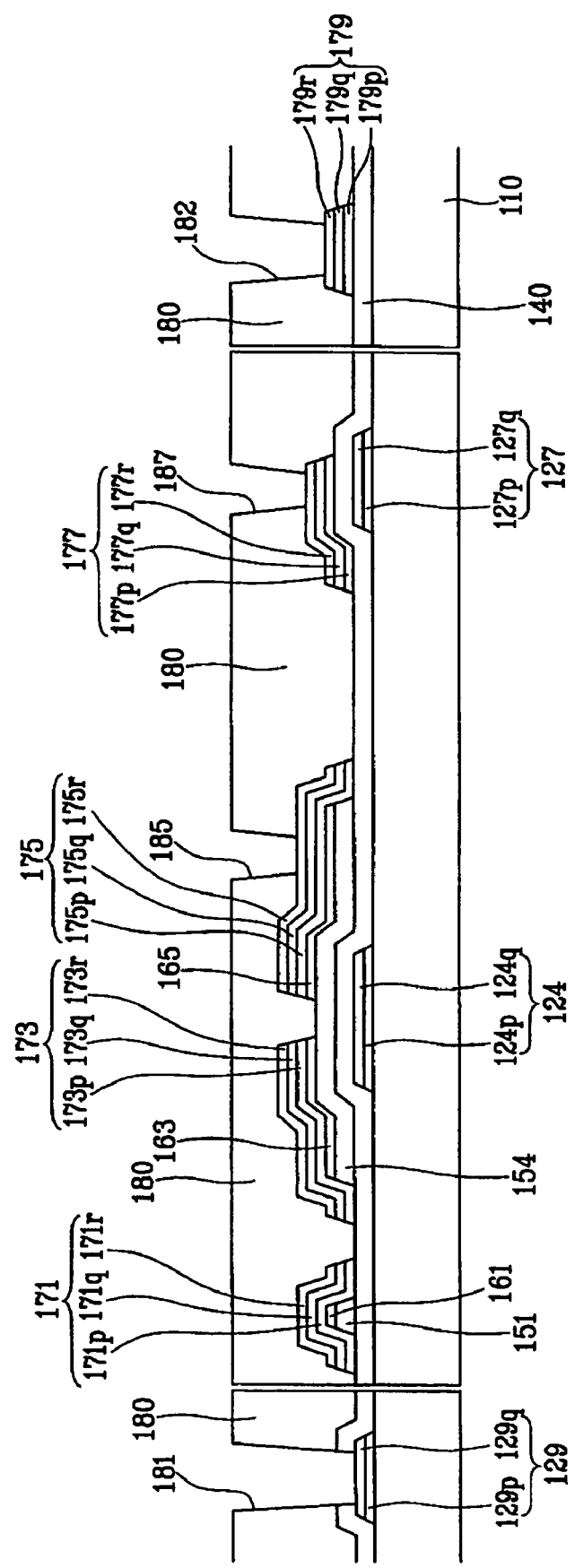
FIG. 6B is a sectional view of the TFT array panel shown in FIG. 6A taken along the line VIb-VIb' in the step following the step shown in FIG. 5B.

Looking at FIG. 6A and FIG. 6B, a passivation layer 180 is deposited and dry etched along with the gate insulating layer 140 to form a plurality of contact holes 181, 185, 187, and 182. Gate insulating layer 140 and the passivation layer 180 are preferably etched under an etch condition having substantially the same etch ratio for both gate insulating layer 140 and passivation layer 180.

When the passivation layer 180 is made of a photosensitive material, the contact holes 181, 185, 187, and 182 can be formed only by a photolithography process.

Next, an ITO layer having a thickness of about 400 Å to 1500 Å is deposited on the passivation layer 180.

Then, photoresist is coated on the ITO layer and is illuminated with a light through a photo-mask to develop the photoresist.

Next, the ITO layer is etched with the etchant of embodiment 2 to form a plurality of pixel electrodes 190. The etching is performed at a temperature between about 35° C. and 45° C. for approximately 30 seconds to 200 seconds by spraying an etchant on the substrate.

As a result, pixel electrodes 190 and contact assistants 81 and 82 have lateral sides which are inclined relative to a surface of the substrate 110 at an angle of about 50 degrees.

In the present invention, since gate lines 121, data lines 171 and drain electrodes 175, and pixel electrodes 190 are patterned with the same etchant and etching conditions, costs are saved and manufacturing processes are simplified. Furthermore, all conductive layers etched with an etchant of the present invention have a good profile.

In the above descriptions, Al—Nd, Mo, Mo—Nb, and IZO are exemplified as conductive materials for signal lines and pixel electrodes. However, an etchant according to the present invention may etch all conductive materials including Al or Mo metals, as well as ITO. An etchant according to the present invention may also etch other conductive materials.

Multi-layer signal lines are exemplified in the present embodiment but single layer signal lines may be applied.

Figure 7:
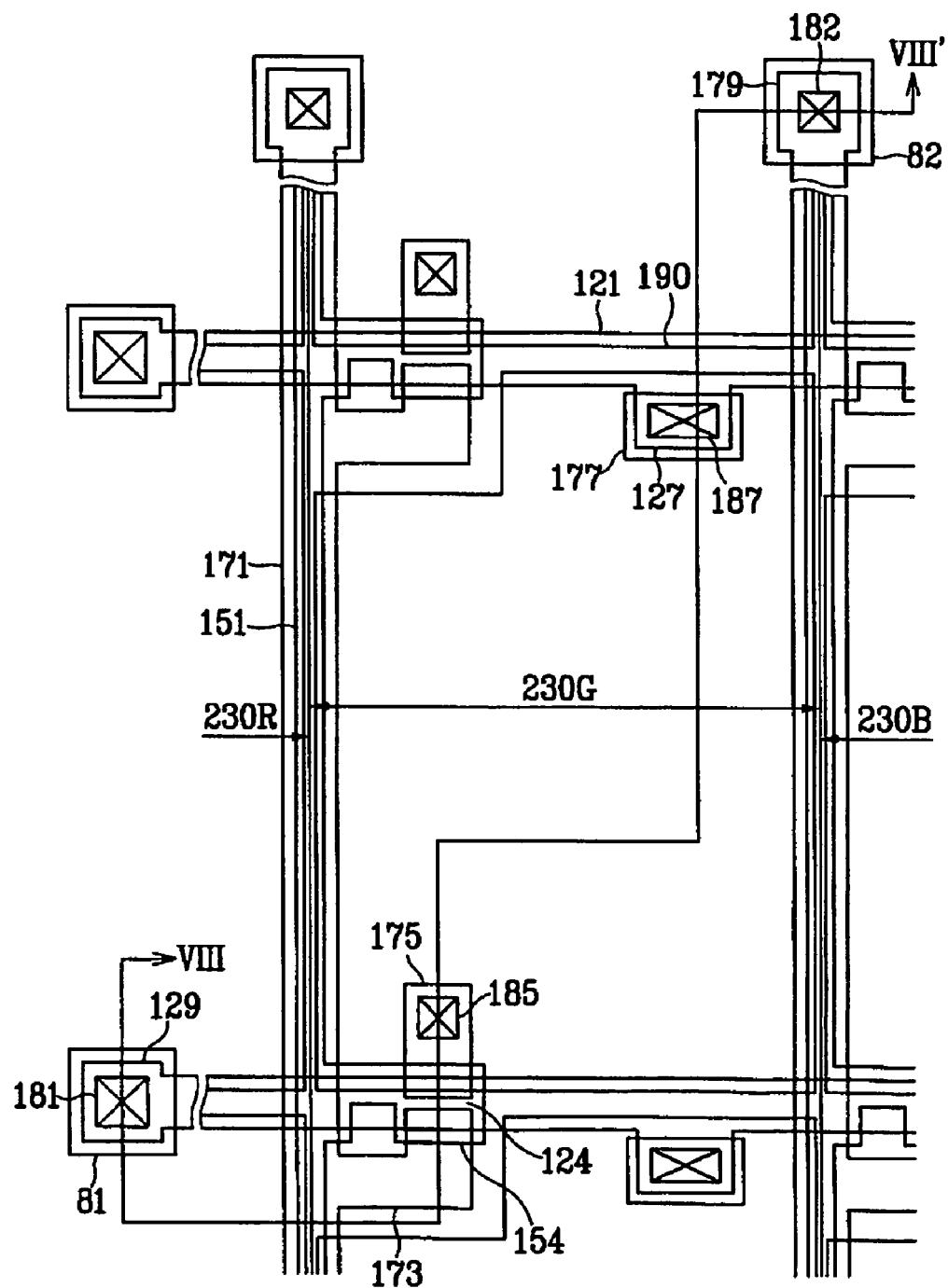
FIG. 7 is a layout view of a TFT array panel for an LCD according to another embodiment of the present invention.
Figure 8:
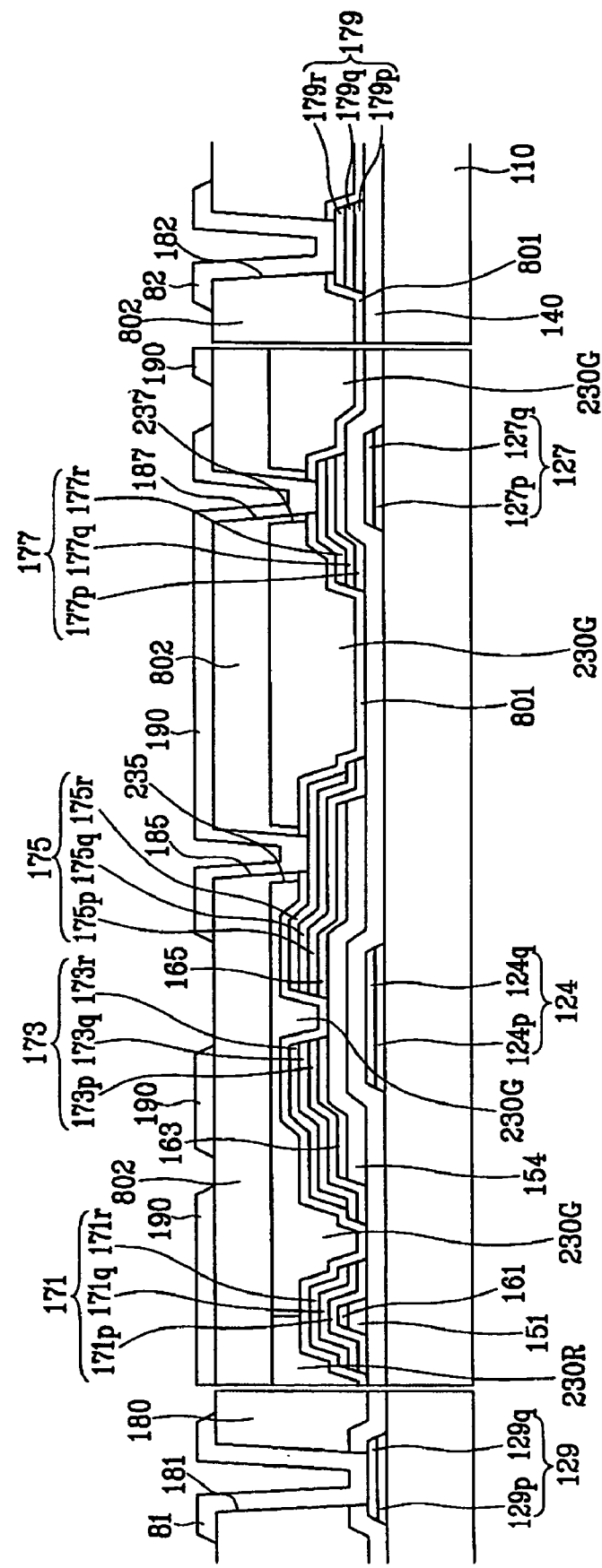
FIG. 8 is a sectional view of the TFT array panel shown in FIG. 7 taken along the line VIII-VIII'.
Figure 9A:
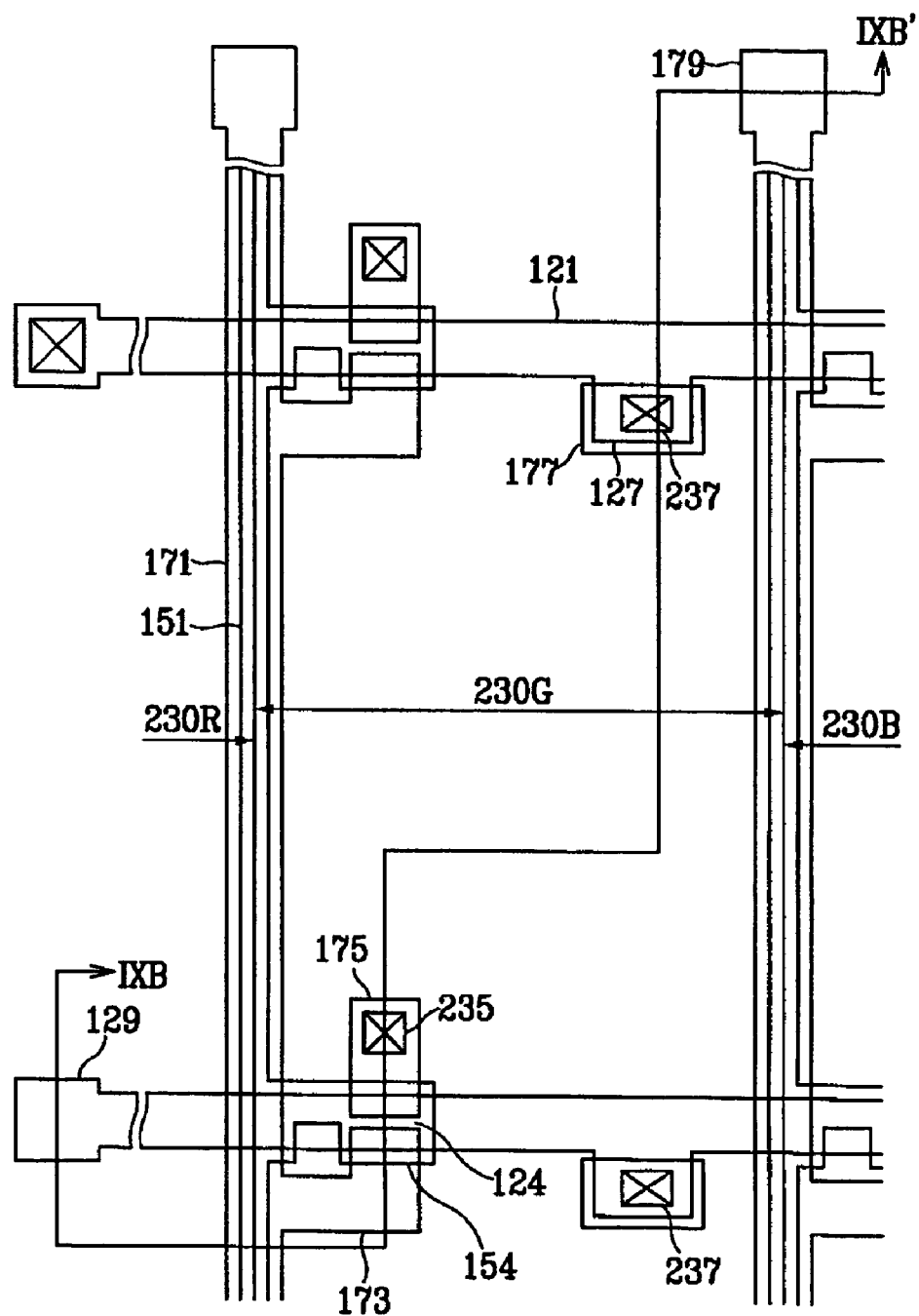
FIG. 9A and FIG. 10A are sectional views of the TFT array panel shown in FIG. 7 and FIG. 8 in intermediate steps of a manufacturing method according to another embodiment of the present invention.
Figure 9B:
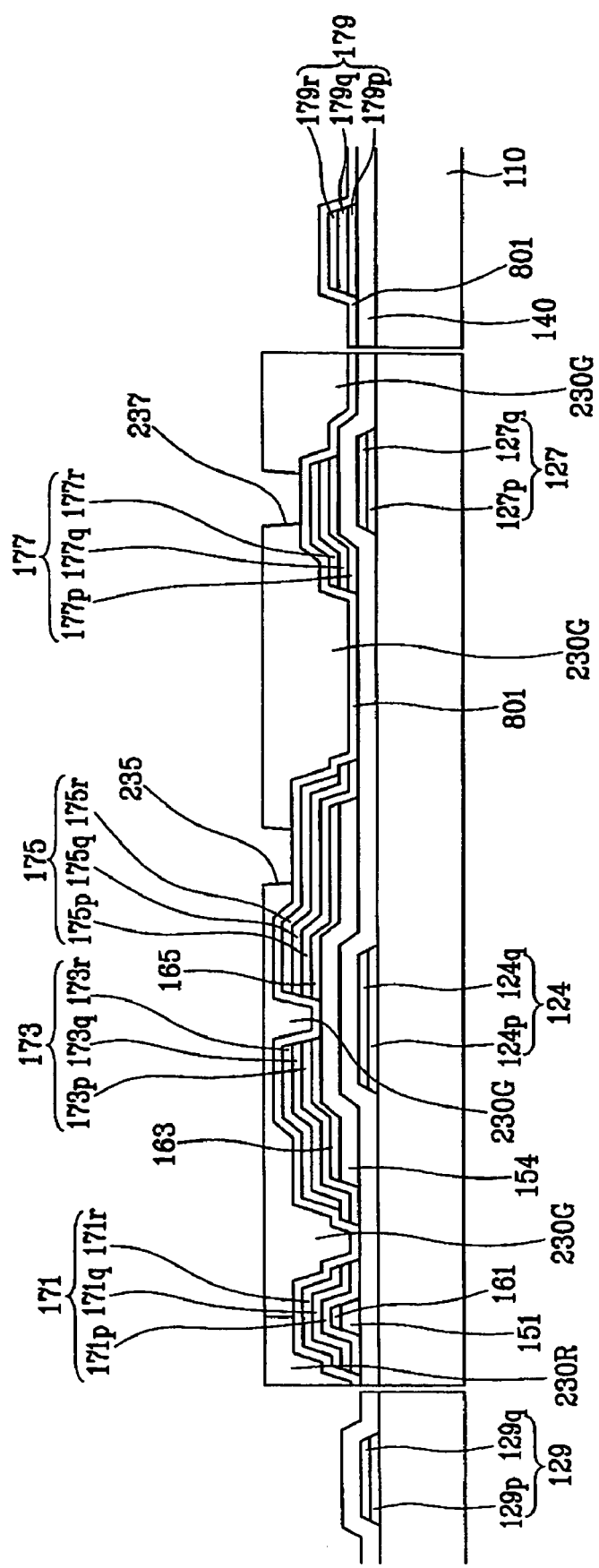
FIG. 9B is a sectional view of the TFT array panel shown in FIG. 9A taken along the line IXb-IXb'.

As shown in FIG. 7 and FIG. 8, another embodiment of the invention illustrates a thin film transistor array panel having color filters. The pixel electrode panel has a similar structure as the one previously described and is formed in a similar manner.

Here, color filters 230R, 230G, and 230B are formed on data line 171, drain electrode 175, and storage capacitor conductor 177. Color filters 230R, 230G, and 230B are formed along pixel columns that are partitioned by data lines 171. The red, green, and blue color filters 230R, 230G, and 230B, respectively, are lit up in turn.

Color filters 230R, 230G, and 230B are not formed on the end portions of gate lines 121 and data lines 171, which are connected to external circuits. Two adjacent color filters 230R, 230G, and 230B may overlap each other on data lines 171. Accordingly, light leakage that may arise around a pixel area is prevented by the overlapping of color filters 230R, 230G, and 230B. All of the red, green, and blue color filters 230R, 230G, and 230B may be disposed on the data line 171 to overlap each other.

A first interlayer insulating layer 801 is formed under the color filters 230R, 230G, and 230B to prevent their pigments from permeating into the semiconductor protrusion 154. A second interlayer insulating layer 802 is formed on top of the color filters 230R, 230G, and 230B to prevent their pigments from permeating into a LC layer (not illustrated).

Interlayer insulating layers 801 and 802 may be made of an insulating material with a low dielectric constant, such as a-Si:C:O, a-Si:O:F, or SiNx.

As described above, when the color filters 230R, 230G, and 230B are formed on the thin film transistor array panel and overlap each other on the data line 171, the opposite panel may have only a common electrode. Accordingly, assembly of the TFT panel and the opposite panel is easy and the aperture ratio increases.

In second interlayer insulating layer 802, a plurality of contact holes 181, 185, 187, and 182 are formed to expose gate line end portion 129, drain electrode 175, storage capacitor conductor 177, and data line end portion 179 respectively.

A plurality of pixel electrodes 190 and a plurality of contact assistants 82, which are made of IZO or ITO, are formed on second interlayer insulating layer 802.

As before pixel electrode 190 is physically and electrically connected with the drain electrode 175 and the storage capacitor conductor 177 through the contact holes 185 and 187, respectively, and, thus, pixel electrode 190 still receives the data voltage from drain electrode 175 and transmits it to storage capacitor conductor 177.

A method of manufacturing a TFT array panel will now be described with reference to FIG. 9A through FIG. 10B, which is similar to the previously described method as shown in FIG. 3A through 6B.

In this method, however, organic photo-resist materials respectively containing pigments of red, green, and blue can be coated and patterned by a photo process to form a plurality of color filters 230R, 230G, and 230B in sequence. Here, a first interlayer insulating layer 801 made of an inorganic insulating material such as silicon nitride (SiNx) or silicon oxide (SiO$_2$) is formed on the data lines 171 and drain electrodes 175 before forming the color filters 230R, 230G, and 230B. At this time, openings 235 and 237 exposing drain electrode 175 and storage capacitor conductor 177 are simultaneously formed.

Figure 10A:
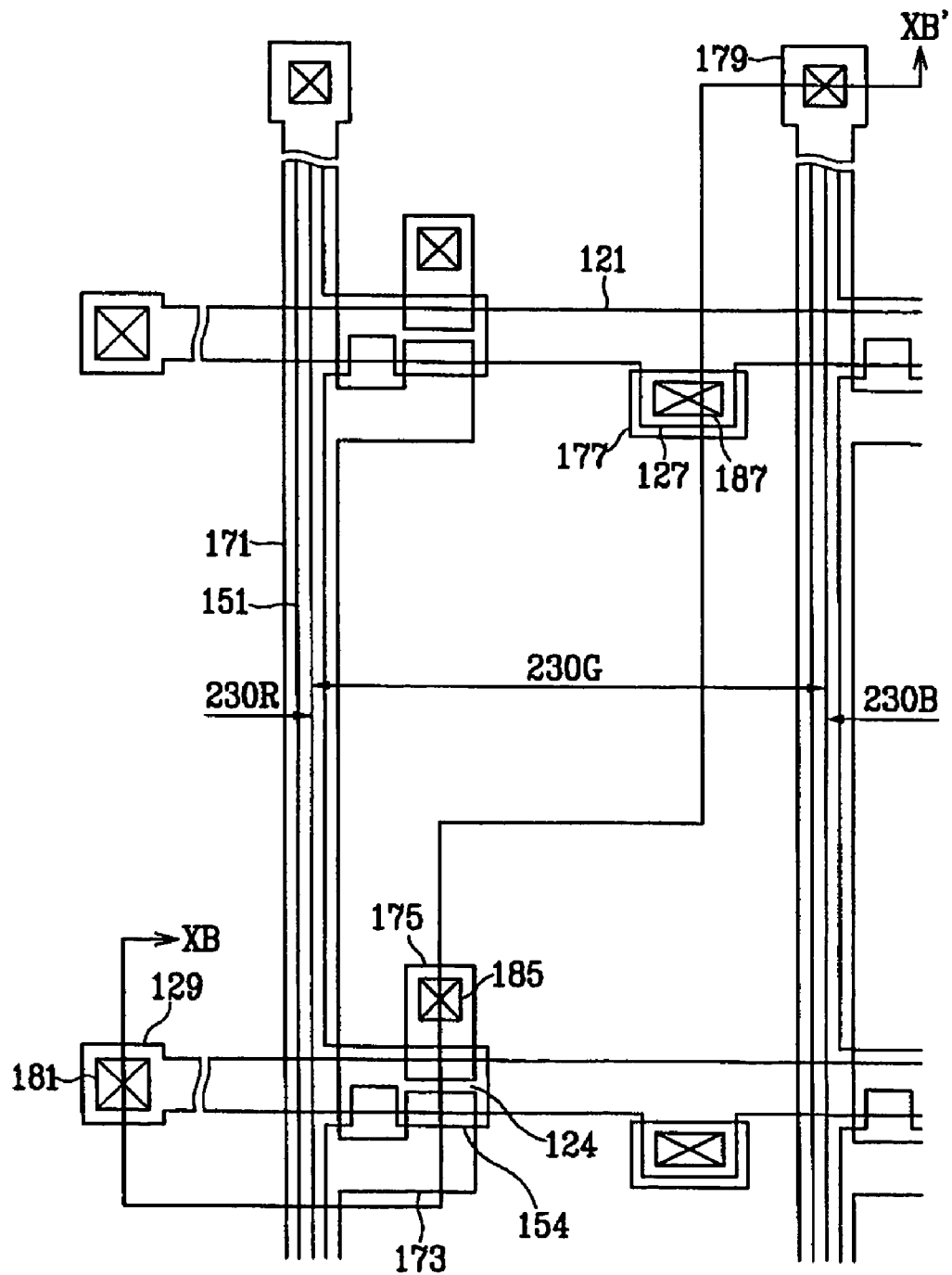
Figure 10B:
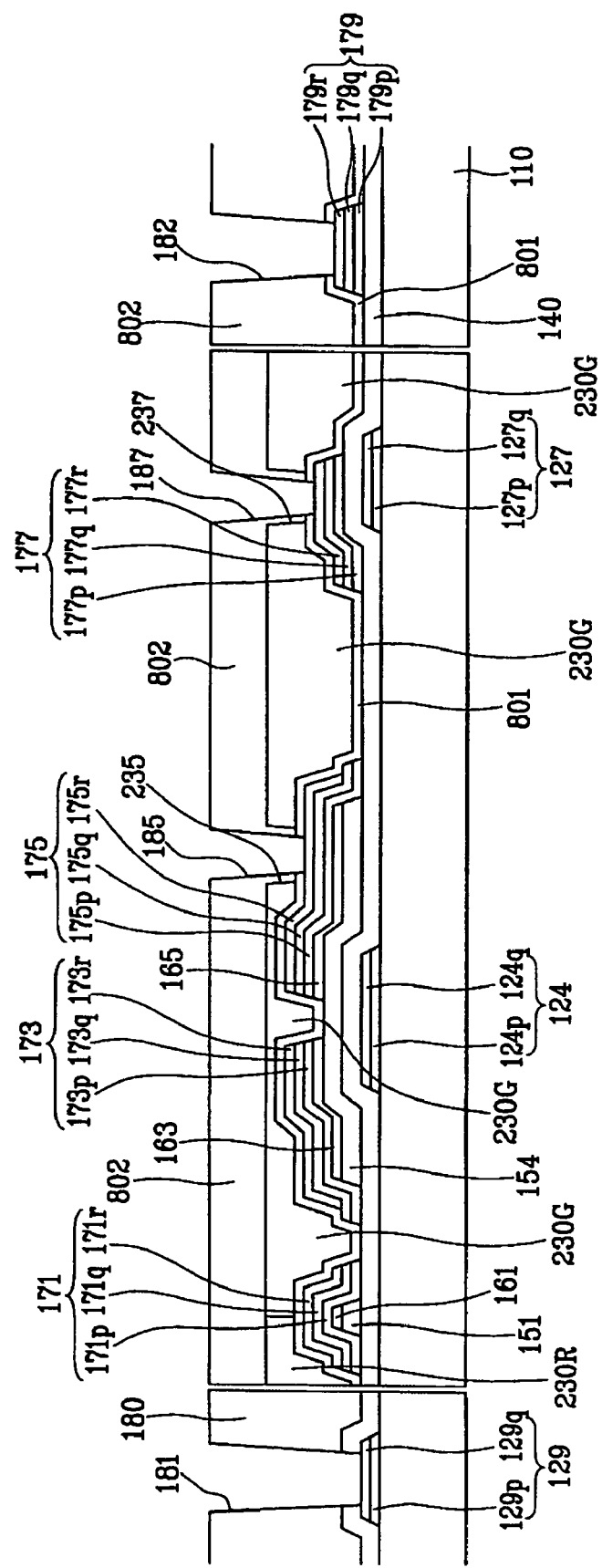
FIG. 10B is a sectional view of the TFT array panel shown in FIG. 10A taken along the line Xb-Xb'.

Referring to FIGS. 10A and 10B, a second interlayer insulating layer 802 is formed by the coating of an organic insulating film having a low dielectric constant and a good flatness characteristic, or by the PECVD of a low dielectric insulating material such as a-Si:C:O or a-Si:O:F having a dielectric constant lower than about 4.0

Thereafter, first insulating layer 801 and second interlayer insulating layer 802 may be photo-etched to form a plurality of contact holes 181, 182, 185, and 187. Here, contact holes 185 and 187 exposing drain electrode 175 and storage capacitor conductor 177 are formed in the openings 235 and 237 of color filters 230R, 230G, and 230B.

Finally, as shown in FIG. 7 and FIG. 8, a plurality of pixel electrodes 190 and a plurality of contact assistants 81 and 82 can be formed by sputtering and photo-etching an IZO layer or an ITO layer. Pixel electrodes 190 are connected to drain electrodes 175 and storage capacitor conductor 177 through respective contact holes 185 and 187.

Pixel electrodes 190 may be formed using the same etchant and etching conditions as gate lines 121 and data lines 171.

Pixel electrodes 190 can have side slopes of an angle between about 40 degrees and 50 degrees and have a CD skew of from about 0.2 μm to 0.3 μm.

Figure 12A:
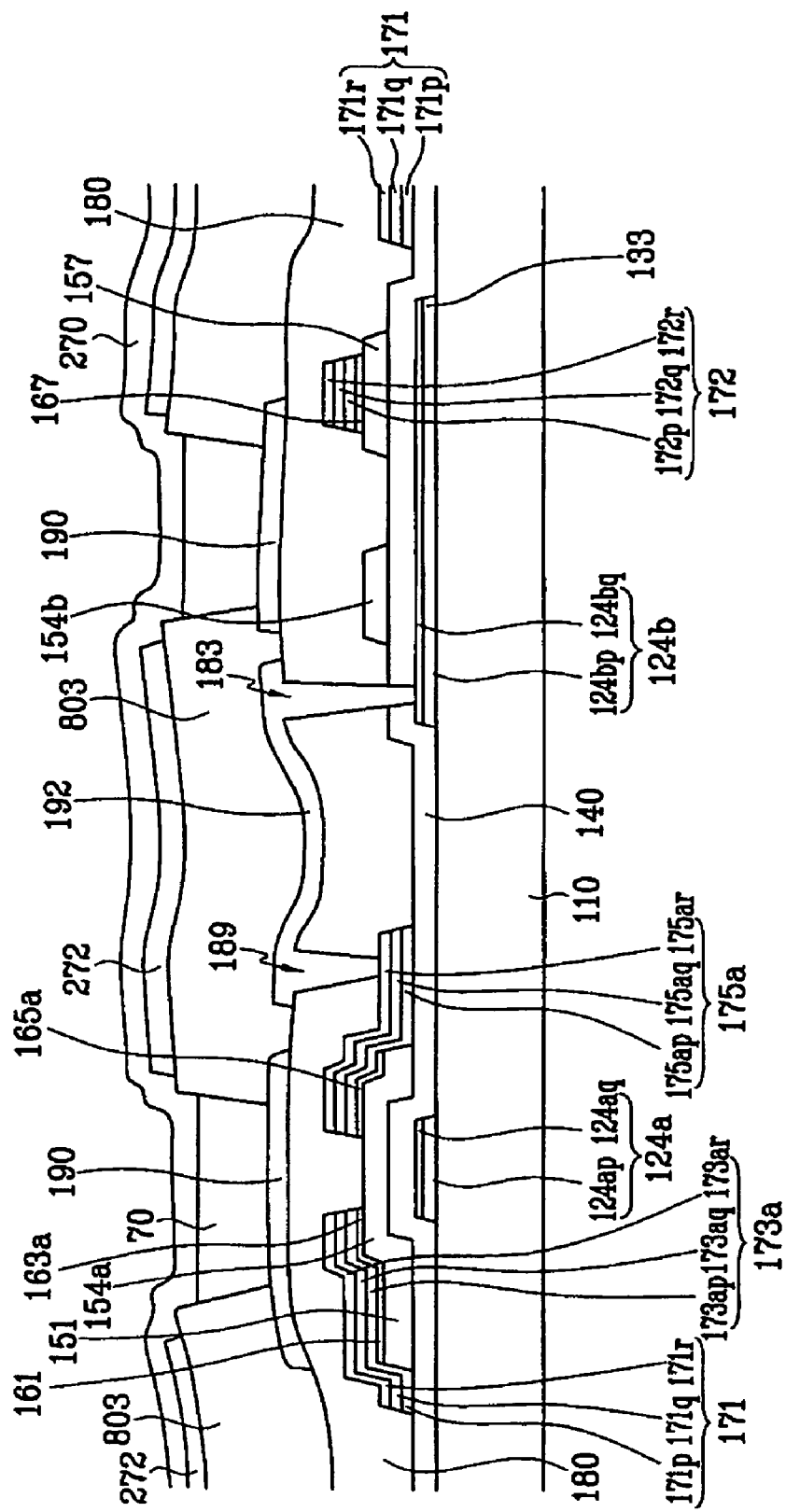
FIG. 12A and FIG. 12B are sectional views of the TFT array panel shown in FIG. 11 taken along the line XIIa-XIIa' and the line XIIb-XIIb', respectively.

Now, a TFT panel for an active matrix organic light emitting display (AM-OLED) according to another embodiment of the present invention will be described in reference to FIG. 12A, FIG. 12B and A plurality of gate conductors that include a plurality of gate lines 121, including a plurality of first gate electrodes 124a and a plurality of second gate electrodes 124b, are formed on an insulating substrate 110 such as transparent glass.

Gate lines 121 that transmit gate signals extend substantially in a transverse direction and are separated from each other. First gate electrode 124a protrudes upward. Gate lines 121 may extend to be connected to a driving circuit (not shown) integrated on substrate 110, or they may have an end portion (not shown) having a large area for connection with another layer or an external driving circuit mounted on substrate 110 or on another device such as a flexible printed circuit film (not shown) that may be attached to substrate 110.

Each of the second gate electrodes 124b is separated from gate lines 121 and includes a storage electrode 133 extending substantially in a longitudinal direction between two adjacent gate lines 121.

The first gate electrodes 124a, the second gate electrodes 124b, and storage electrodes 133 can have lower layers 124ap, 124bp, and 133p and upper layers 124aq, 124bq, and 133q. Lower layers 124ap, 124bp, and 133p can be made of a material including Al, like Al itself or Al—Nd. Upper layers 124aq, 124bq, and 133q can be made of a material including Mo, like Mo itself or MoN.

In addition, the lateral sides of gate conductors 121 and 124b are inclined relative to a surface of the substrate 110 at an angle that ranges from about 30 degrees to 80 degrees.

A gate insulating layer 140, preferably made of SiNx, is formed on gate conductors 121 and 124b.

A plurality of semiconductor stripes 151 and islands 154b, preferably made of hydrogenated amorphous silicon (abbreviated to "a-Si") or polysilicon, are formed on gate insulating layer 140. Each semiconductor stripe 151 extends substantially in the longitudinal direction and has a plurality of projections 154a branched out towards first gate electrodes 124a. Each semiconductor island 154b crosses a second gate electrode 124b and includes a portion 157 overlapping storage electrode 133 of second gate electrode 124b.

A plurality of ohmic contact stripes 161 and ohmic contact islands 163b, 165a, and 165b, which are preferably made of silicide or n+ hydrogenated a-Si heavily doped with an n-type impurity such as phosphorous, may be formed on semiconductor stripes 151 and islands 154b. Each ohmic contact stripe 161 has a plurality of projections 163a, formed in pairs with ohmic contact islands 165a on semiconductor stripe projections 154a. Ohmic contact islands 163b and 165b are located in pairs on the semiconductor islands 154b.

The lateral sides of the semiconductor stripes 151 and islands 154b and the ohmic contacts 161, 163b, 165b, and 165b are inclined relative to a surface of the substrate at angles that are preferably in a range from about 30 degrees to 80 degrees.

A plurality of data conductors including a plurality of data lines 171, a plurality of voltage transmission lines 172, a plurality of first drain electrodes 175a, and a plurality of second drain electrodes 175b are formed on ohmic contacts 161, 163b, 165b, and 165b and gate insulating layer 140.

Data lines 171 that transmit data signals extend substantially in the longitudinal direction and cross gate lines 121. Each data line 171 includes a plurality of first source electrodes 173a, an end portion having a large area for contact with another layer or an external device. The data lines 171 may be directly connected to a data driving circuit for generating the gate signals that may be integrated on substrate 110.

Voltage transmission lines 172 for transmitting driving voltages extend substantially in the longitudinal direction and cross gate lines 121. Each voltage transmission line 172 includes a plurality of second source electrodes 173b. Voltage transmission lines 172 may be connected to each other and overlap the storage region 157 of the semiconductor islands 154b.

The first and second drain electrodes 175a and 175b are separated from the data lines 171 and the voltage transmission lines 172, and from each other. Each pair of the first source electrodes 173a and the first drain electrodes 175a are disposed opposite each other with respect to a first gate electrode 124a, and each pair of the second source electrodes 173b and the second drain electrodes 175b are disposed opposite each other with respect to a second gate electrode 124b.

A first gate electrode 124a, a first source electrode 173a, and a first drain electrode 175a, along with semiconductor stripe projection 154a, form a switching TFT having a channel formed in the projection 154a disposed between the first source electrode 173a and the first drain electrode 175a. Meanwhile, a second gate electrode 124b, a second source electrode 173b, and a second drain electrode 175b, along with a semiconductor island 154b, form a driving TFT having a channel formed in semiconductor island 154b disposed between the second source electrode 173b and the second drain electrode 175b.

Data conductors 171, 172, 175a, and 175b preferably have first layers 171p, 172p, 175ap, and 175bp, second layers 171q, 172q, 175aq, and 175bq, and third layers 171r, 172r, 175ar, and 175br. The second layers 171q, 172q, 175ap, and 175bp are made of an Al alloy. The first layers 171p, 172p, 175ap, and 175bp and third layers 171r, 172r, 175ar, and 175br are respectively disposed at lower and upper sides of the second layers 171q, 172q, 175aq, and 175bq. The first layers 171p, 172p, 175ap, and 175bp and the third layers 171r, 172r, 175ar, and 175br are made of Mo—Nb, Like gate conductors 121 and 124b, data conductors 171, 172, 175a, and 175b have tapered lateral sides relative to the surface of the substrate 110, inclined at angles that range from about 30 degrees to 80 degrees.

Ohmic contacts 161, 163b, 165b, and 165b are interposed only between underlying semiconductor stripes 151 and islands 154b and overlying data conductors 171, 172, 175a, and 175b to reduce the contact resistance therebetween. Semiconductor stripes 151 include a plurality of exposed portions that are not covered with the data conductors 171, 172, 175a, and 175b.

Most of the semiconductor stripe 151 is narrower than data line 171, but semiconductor stripe 151 broadens near an area where the semiconductor stripe 151 crosses gate line 121 to prevent disconnection of the data line 171 as mentioned above.

Passivation layer 180 is formed on the data conductors 171, 172, 175a, and 175b and the exposed portions of semiconductor stripes 151 and islands 154b. Passivation layer 180 is preferably made of an inorganic material, such as SiNx or SiO$_2$, a photosensitive organic material having good flatness characteristics, or a low dielectric insulating material having a dielectric constant lower than 4.0 such as a-Si:C:O or a-Si:O:F formed by PECVD. Passivation layer 180 may also include a lower film of an inorganic insulator and an upper film of an organic insulator.

Passivation layer 180 has a plurality of contact holes 189, 183, 185, 181, and 182 exposing portions of first drain electrode 175a, second gate electrode 124b, second drain electrode 175b, and end portions 129 and 179 of gate line 121 and data line 171, respectively.

Contact holes 181 and 182 expose gate line end portions 129 and data line end portion 179 to connect them with external driving circuits. Anisotropic conductive films are disposed between the output terminals of the external driving circuit and end portions 129 and 179 assist electrical connection and physical adhesion. However, when driving circuits are directly fabricated on substrate 110, contact holes are not formed. When gate driving circuits are directly fabricated on substrate 110 and data driving circuits are formed as separate chips, only contact hole 181 exposing data line end portion 179 is formed.

A plurality of pixel electrodes 190, a plurality of connecting members 902, and a plurality of contact assistants 81 and 82 are formed on passivation layer 180.

Pixel electrode 190 is connected to second drain electrode 175b through contact hole 185. Connecting member 192 connects first drain electrode 175a and second gate electrode 124b through respective contact holes 189 and 183. Contact assistants 81 and 82 are connected to gate line, 129 and data line end portion 179 through contact holes 181 and 182, respectively.

Pixel electrode 190, connecting member 192, and contact assistants 81 and 82 can be made of a transparent conductor such as ITO or IZO.

A partition 803, an auxiliary electrode 272, a plurality of light emitting members 70, and a common electrode 270 are formed on passivation layer 180 and pixel electrodes 190.

Partition 803 is made of an organic or inorganic insulating material that frames organic light emitting cells. Partition 803 is formed along boundaries of pixel electrode 190 and defines a space that can be filled with an organic light emitting material.

Light emitting member 70 is disposed on pixel electrode 190 and is surrounded by partition 803. Light emitting member 70 is made of a light emitting material that emits red, green, or blue light. Red, green, and blue light emitting members 70 are sequentially and repeatedly disposed.

Auxiliary electrode 272 has substantially the same planar pattern as partition 803. Auxiliary electrode 272 contacts common electrode 270 to reduce resistance thereof.

Common electrode 270, which is made of a metal such as Al having low resistivity is formed on partition 803, auxiliary electrode 272, and light emitting member 70. This embodiment illustrates a back emitting OLED. However, a front emitting OLED or dual-side emitting OLED can be produced when common electrode 270 is made of a transparent conductor such as ITO or IZO.

A method of manufacturing the TFT array panel shown in FIG. 11 through FIG. 12B according to an embodiment of the present invention will be now described in detail with reference to FIG. 13 through FIG. 26B.

Figure 13:
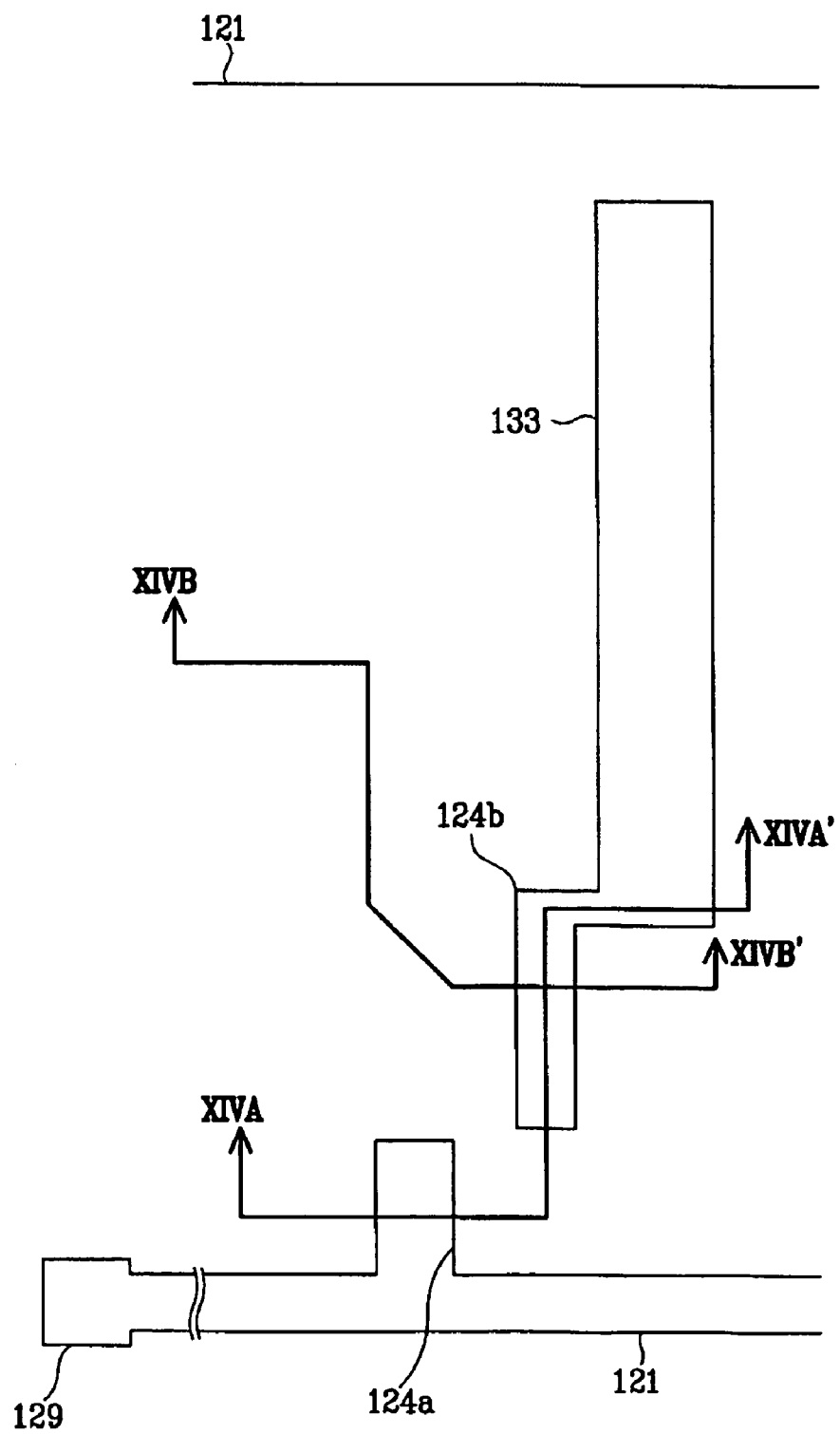
FIG. 13, FIG. 15, FIG. 17, FIG. 19, FIG. 21, FIG. 23, and FIG. 25 are layout views of the TFT array panel shown in FIG. 11, FIG. 12A, and FIG. 12B in intermediate steps of a manufacturing method according to yet another embodiment of the present invention.
Figure 14A:
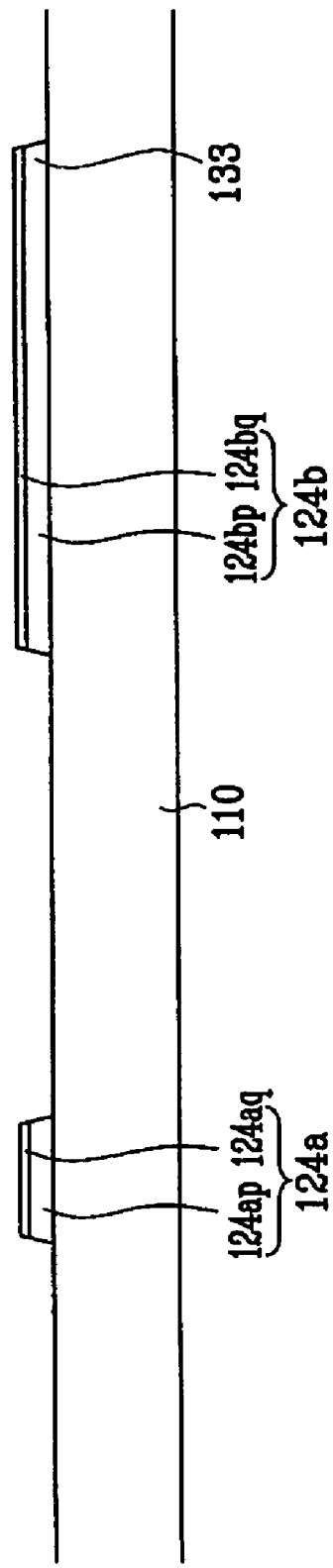
FIG. 14A and FIG. 14B are sectional views of the TFT array panel shown in FIG. 13 taken along the lines XIVa-XIVa' and XIVb-XIVb', respectively.
Figure 14B:
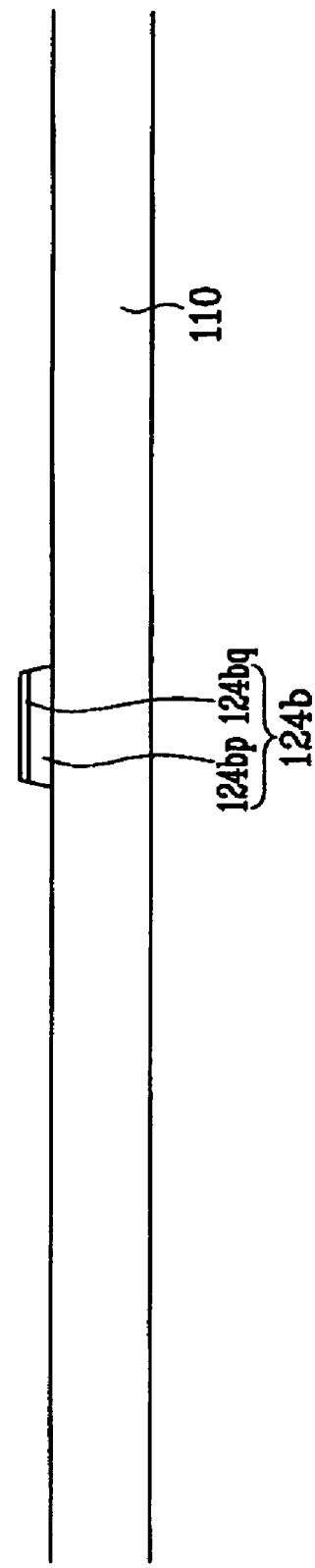

First, as shown in FIG. 13 through FIG. 14B, gate metal layers are deposited on substrate 110. A single metal layer may be formed to form gate lines. However, in the present embodiment, the gate metal layers include a lower layer of Al-alloy and an upper layer of Mo-alloy. Here, the lower layer has a thickness between 1,000 Å and 5,000 Å. The upper layer has a thickness between 50 Å and 2,000 Å.

The upper and lower layers may be simultaneously etched to form a plurality of gate lines 121. The etching is performed at a temperature between approximately 35° C. and 45° C. for about 30 seconds to 200 seconds by spraying an etchant on the substrate.

The etchant of embodiment 2 is preferred, but other etchants, like the etchants of embodiment 1 and embodiment 3, for example, may also be used.

When the gate line is patterned with such an etchant, the gate line has a nice profile because the galvanic effect is reduced and etching uniformity is enhanced over the whole substrate due to surface reforming.

Through the above described processes, a plurality of gate lines 121 having a plurality of first gate electrodes 124a and a plurality of second gate electrodes 124b are formed, as shown in FIG. 13 through FIG. 14B.

Figure 15:
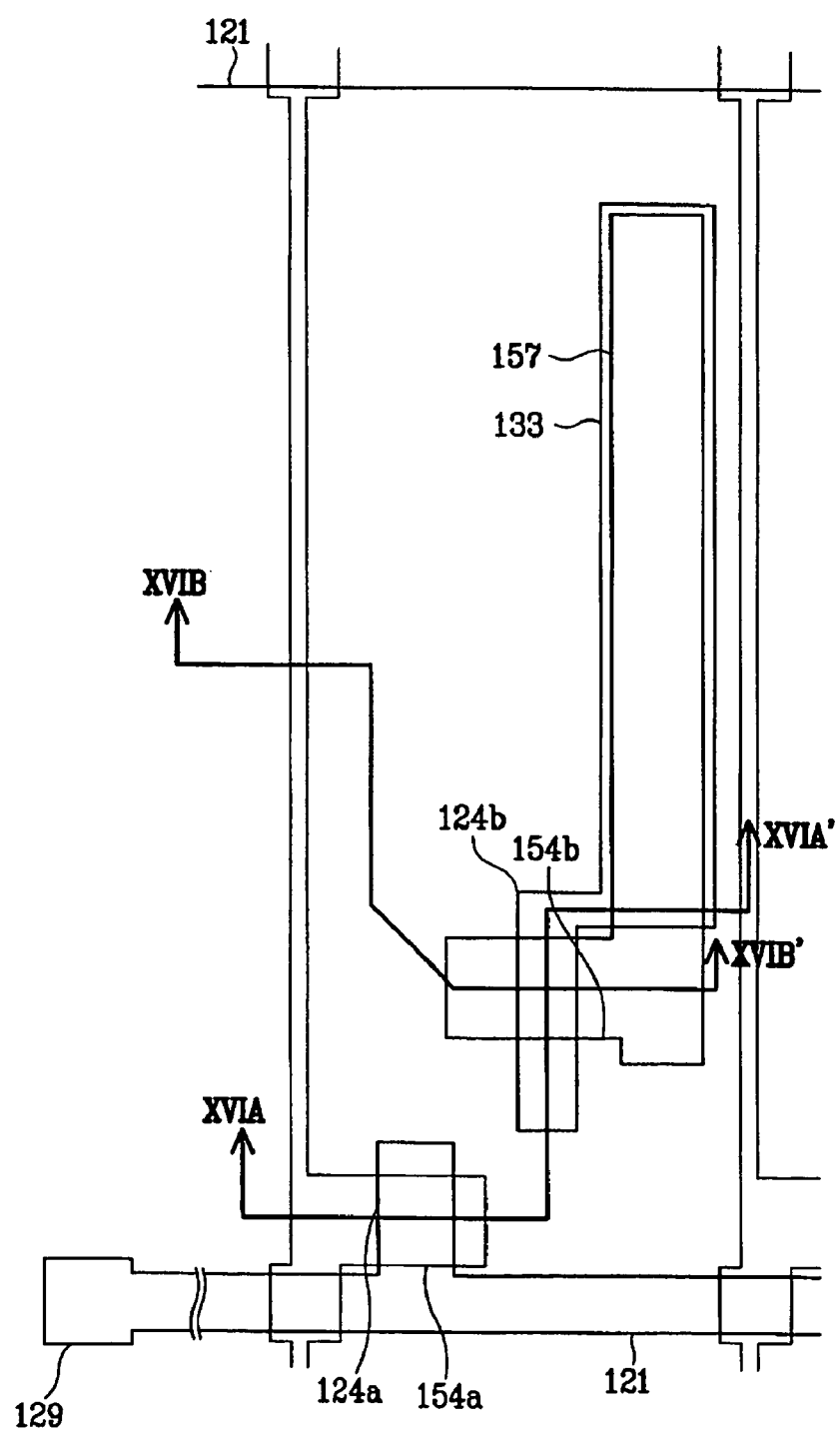
Figure 16A:
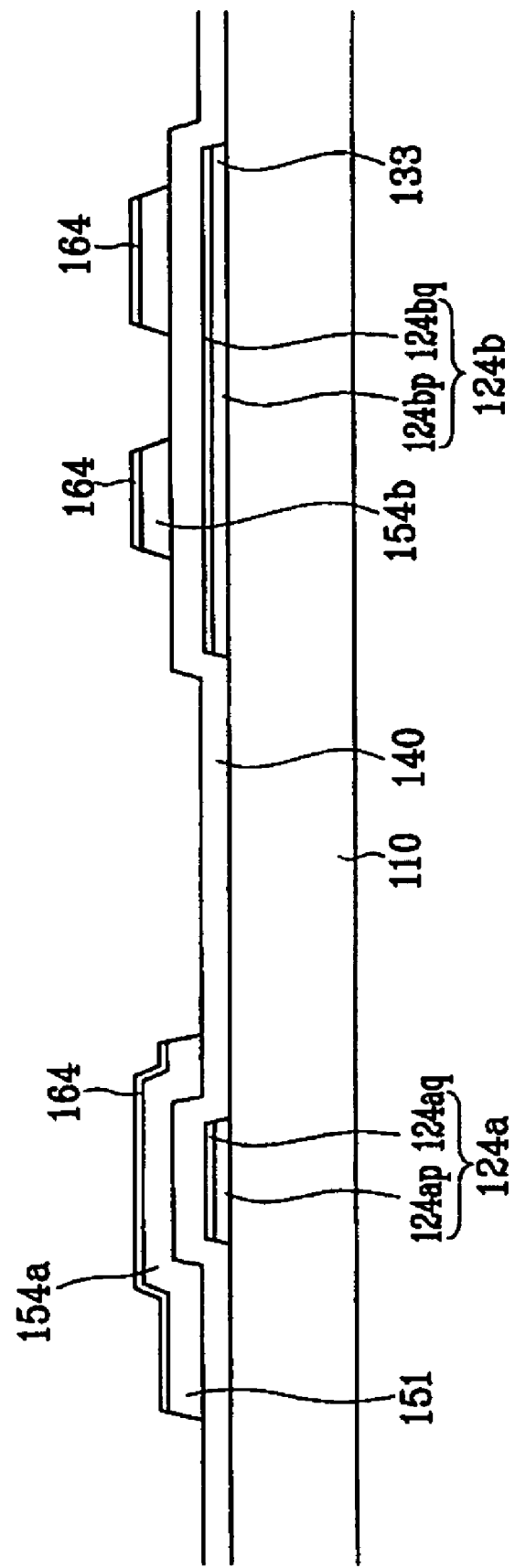

Referring to FIG. 15 through FIG. 16B, after a sequential deposition of gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 and islands 154b, including projections 154a, on gate insulating layer 140. Gate insulating layer 140 is preferably made of silicon nitride with a thickness of about 2,000 Å to 5,000 Å, and the deposition temperature is preferably in a range of about 250° C. to 500° C.

Figure 17:
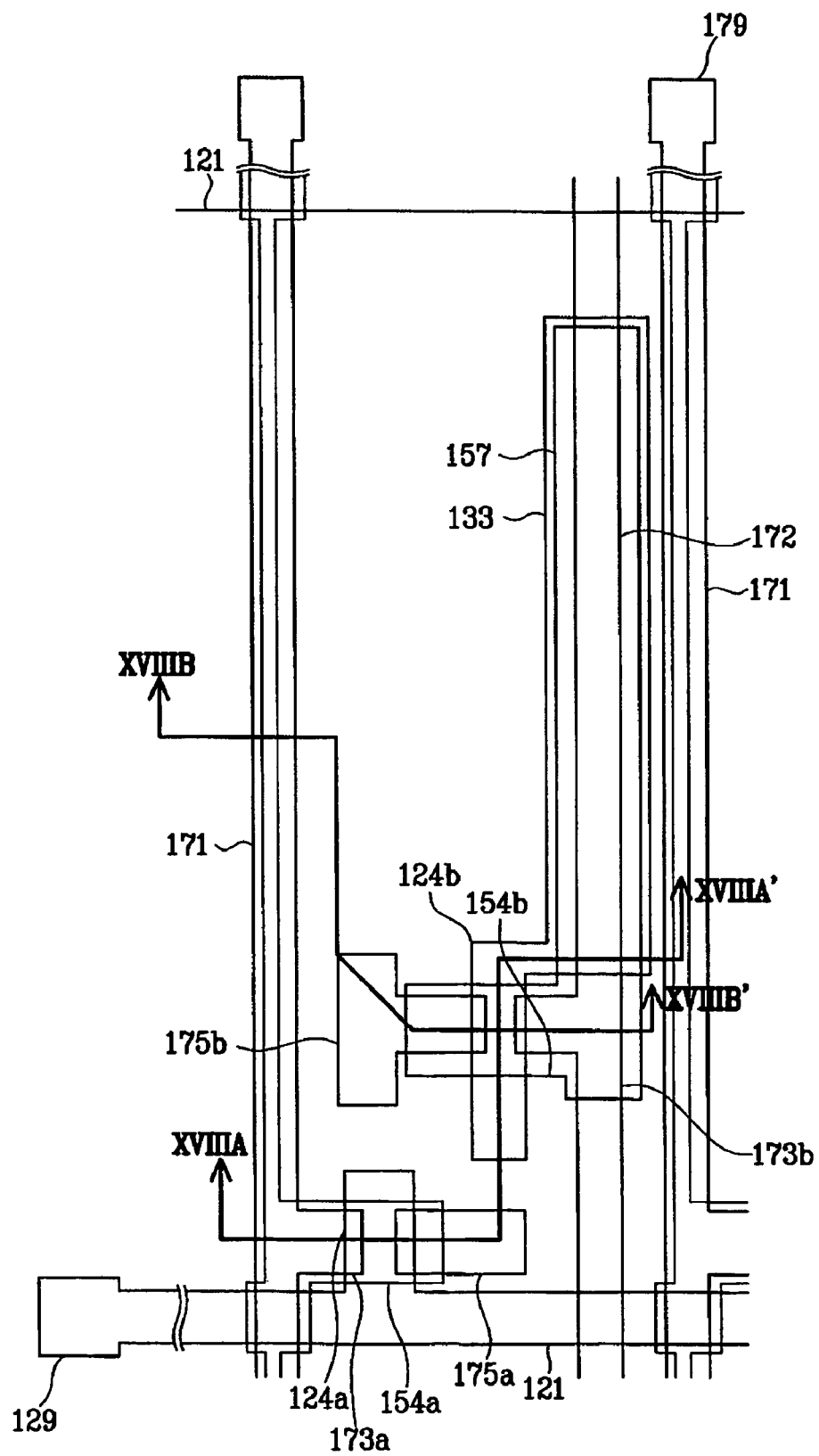
Figure 18A:
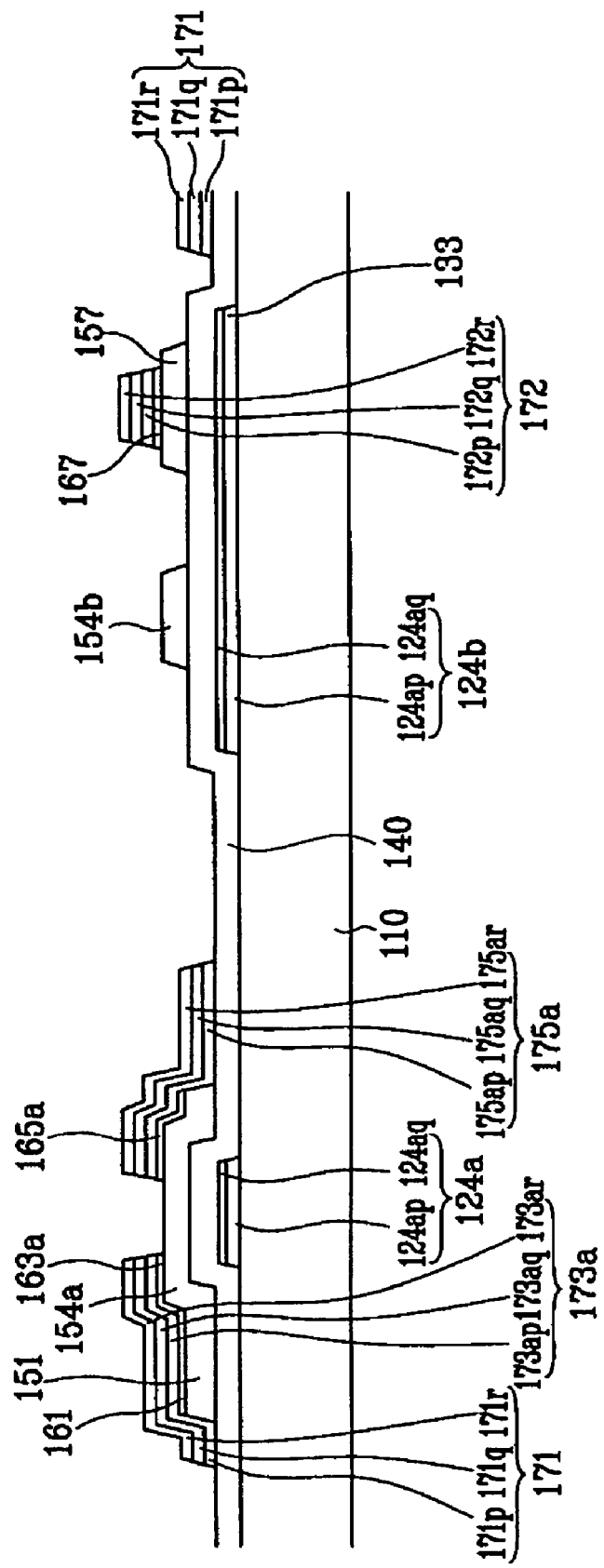
FIG. 18A and FIG. 18B are sectional views of the TFT array panel shown in FIG. 17 taken along the lines XVIIIa-XVIIIa' and XVIIIb-XVIIIb', respectively.
Figure 18B:
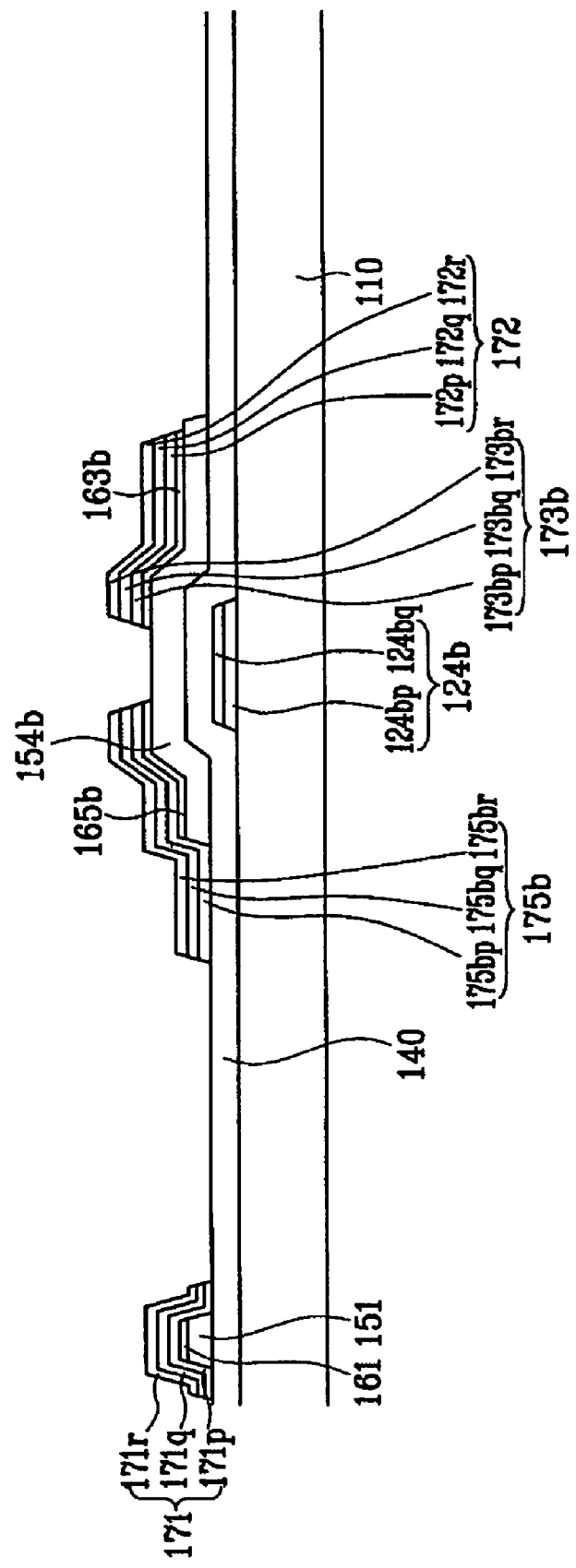

Referring to FIG. 17 through FIG. 18B, a first layer of Mo-alloy, a second layer of Al (or Al-alloy), and a third layer of Mo-alloy can be sequentially deposited on extrinsic semiconductor stripes 164. The three layers are etched using a photoresist (not shown) to form a plurality of data conductors that includes a plurality of data lines 171 including first source electrodes 173a, a plurality of voltage transmission lines 172, which include second source electrodes 173b, and a plurality of first drain electrodes 175a and second drain electrodes 175b.

Here, the triple layered data lines 171, second drain electrodes 175b, and voltage transmission lines 172 can be formed by using the same etchant and etching conditions as those used to form gate lines 121. As a result, data lines 171, second drain electrodes 175b, and voltage transmission lines 172 have side slopes of an angle between approximately 40 degrees and 60 degrees relative to substrate 110 and have a nice profile without undercut or overhang. Data lines 171, second drain electrodes 175b, and voltage transmission lines 172 do not have stains.

Before or after removing the photoresist, portions of the extrinsic semiconductor stripes 164, which are not covered with data conductors 171, 172, 175a, and 175b, can be removed by etching to complete a plurality of ohmic contact stripes 161, which include projections 163a, and a plurality of ohmic contact islands 163b, 165a, and 165b, as well as to expose portions of intrinsic semiconductor stripes 151 and islands 154b.

Oxygen plasma treatment may follow thereafter in order to stabilize the exposed surfaces of semiconductor stripes 151.

Figure 19:
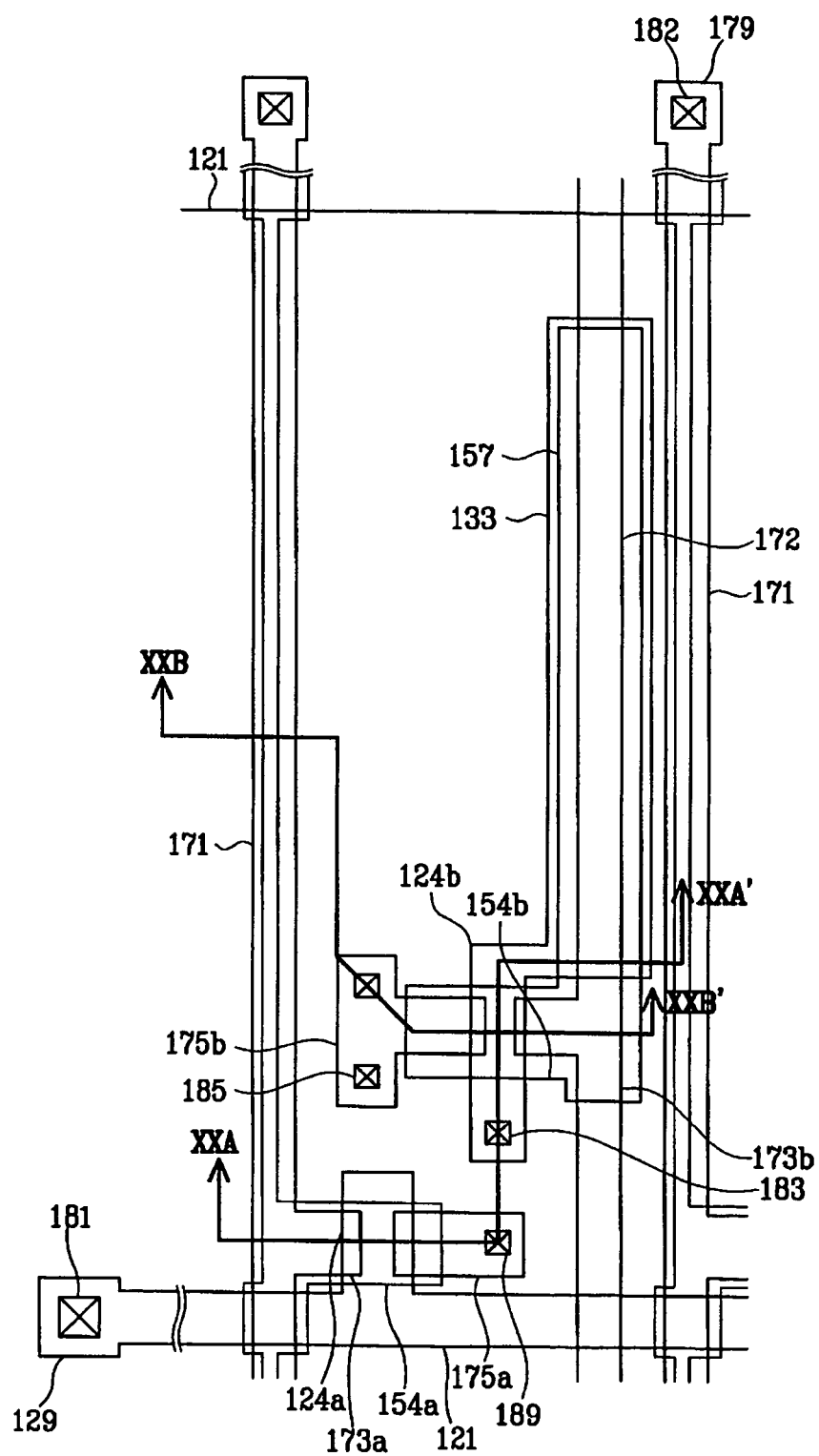
Figure 20A:
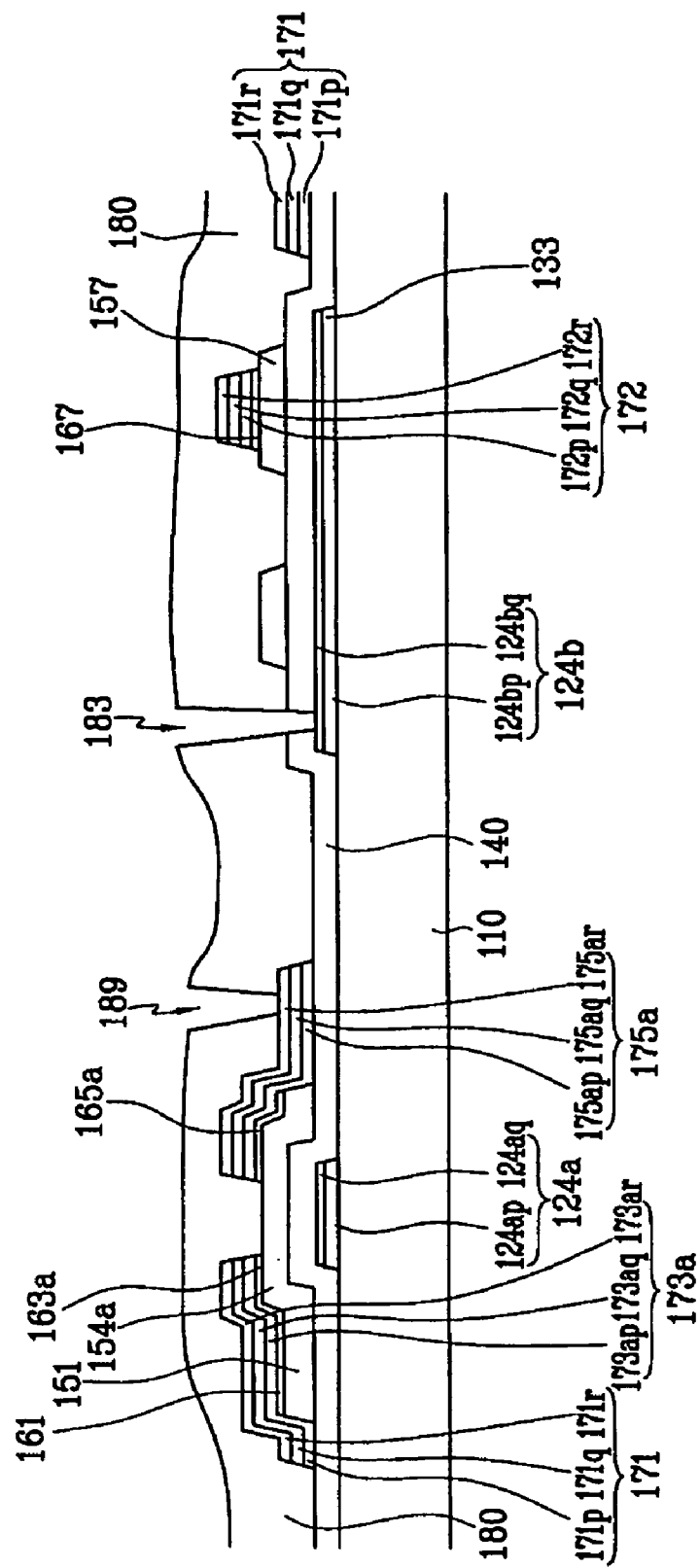
FIG. 20A and FIG. 20B are sectional views of the TFT array panel shown in FIG. 19 taken along the lines XXa-XXa' and XXb-XXb', respectively.
Figure 20B:
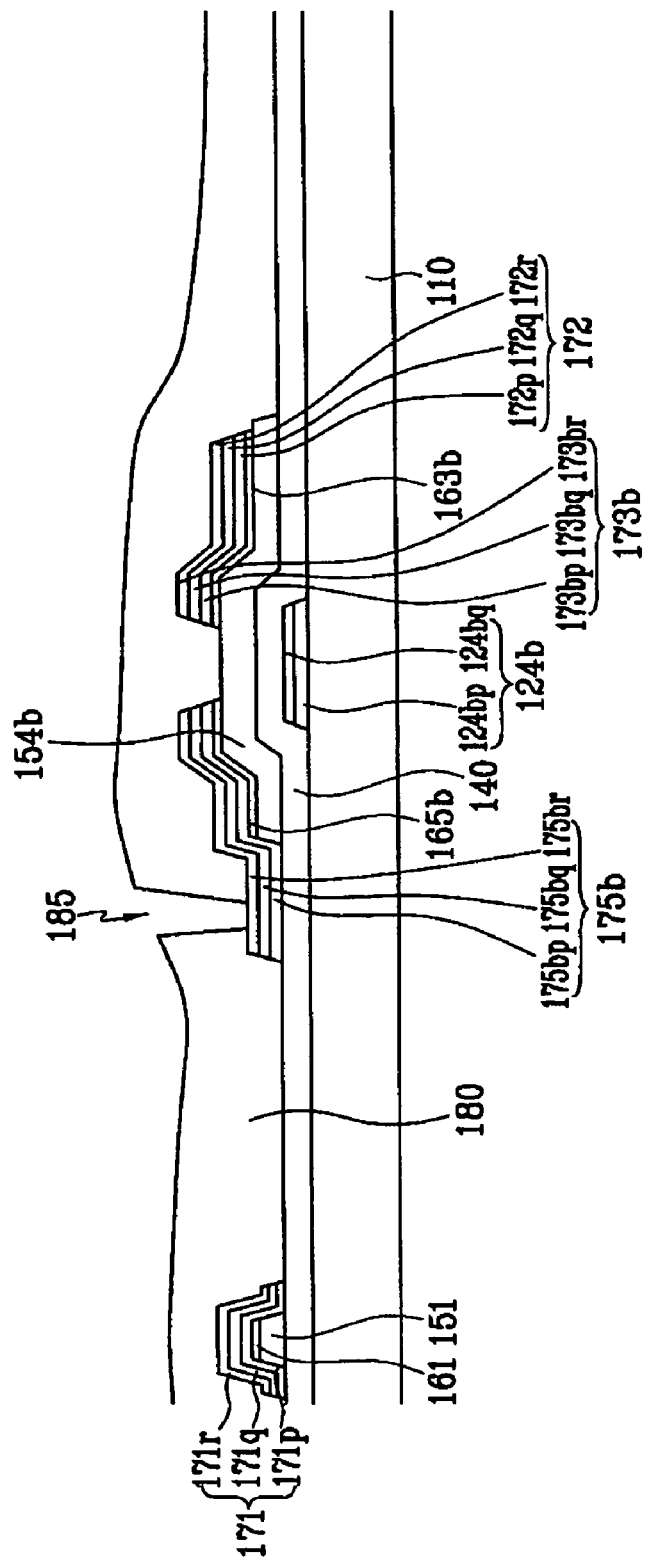

Referring to FIG. 19 through FIG. 20B, a passivation layer 180 can be deposited and patterned to form a plurality of contact holes 189, 185, 183, 181, and 182 that expose first drain electrode 175a, second drain electrode 175b, second gate electrode 124b, gate line end portion 129, and data line end portion 179, respectively.

Figure 21:
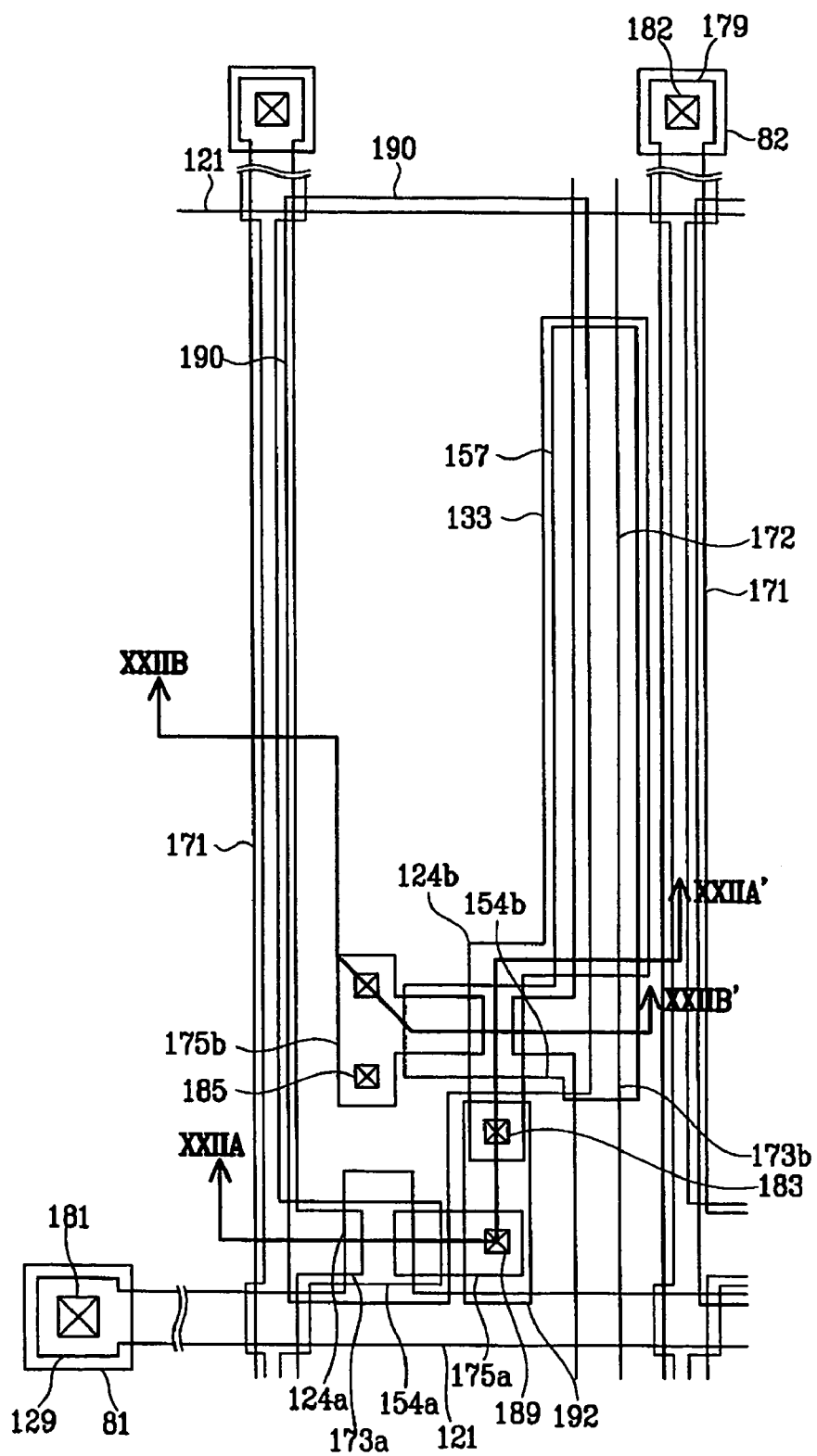
Figure 22A:
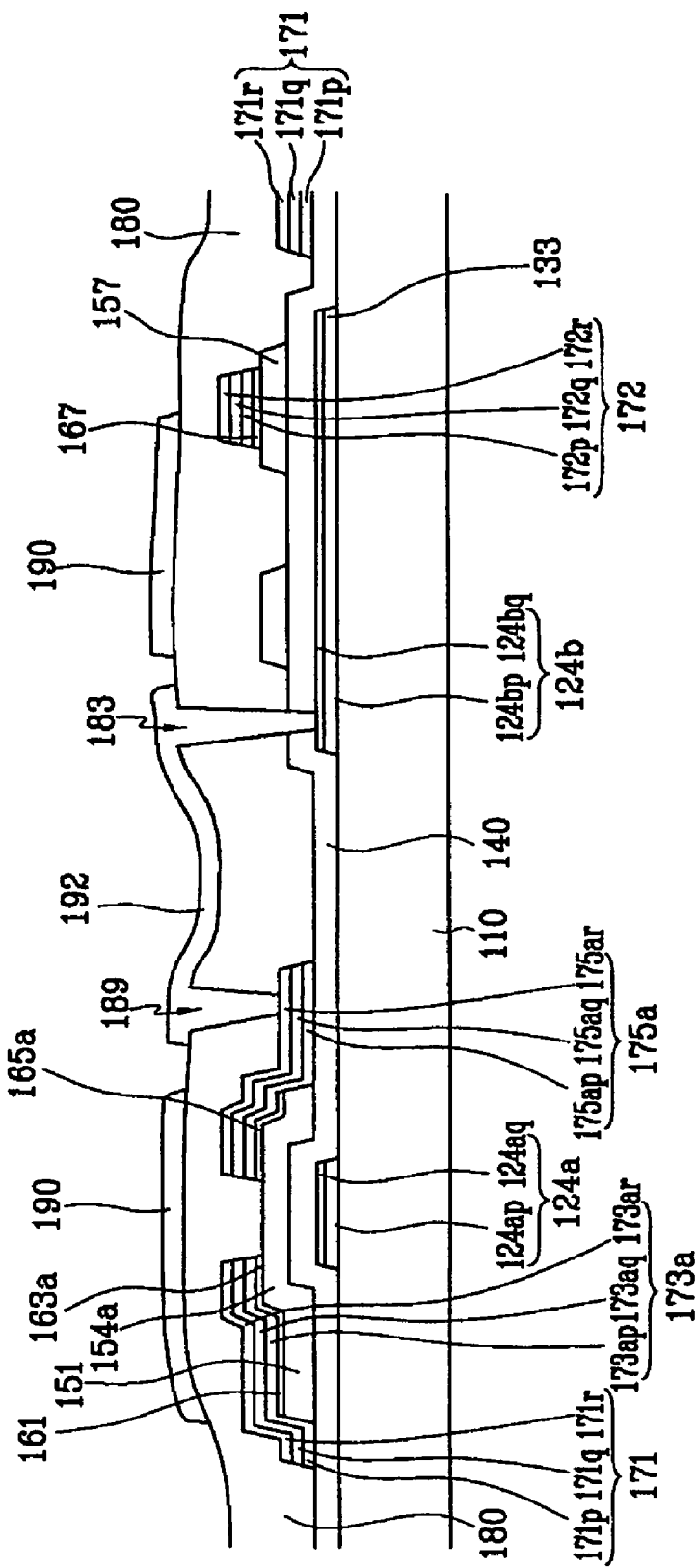
FIG. 22A and FIG. 22B are sectional views of the TFT array panel shown in FIG. 21 taken along the lines XXIIa-XXIIa' and XXIIb-XXIIb', respectively.
Figure 22B:
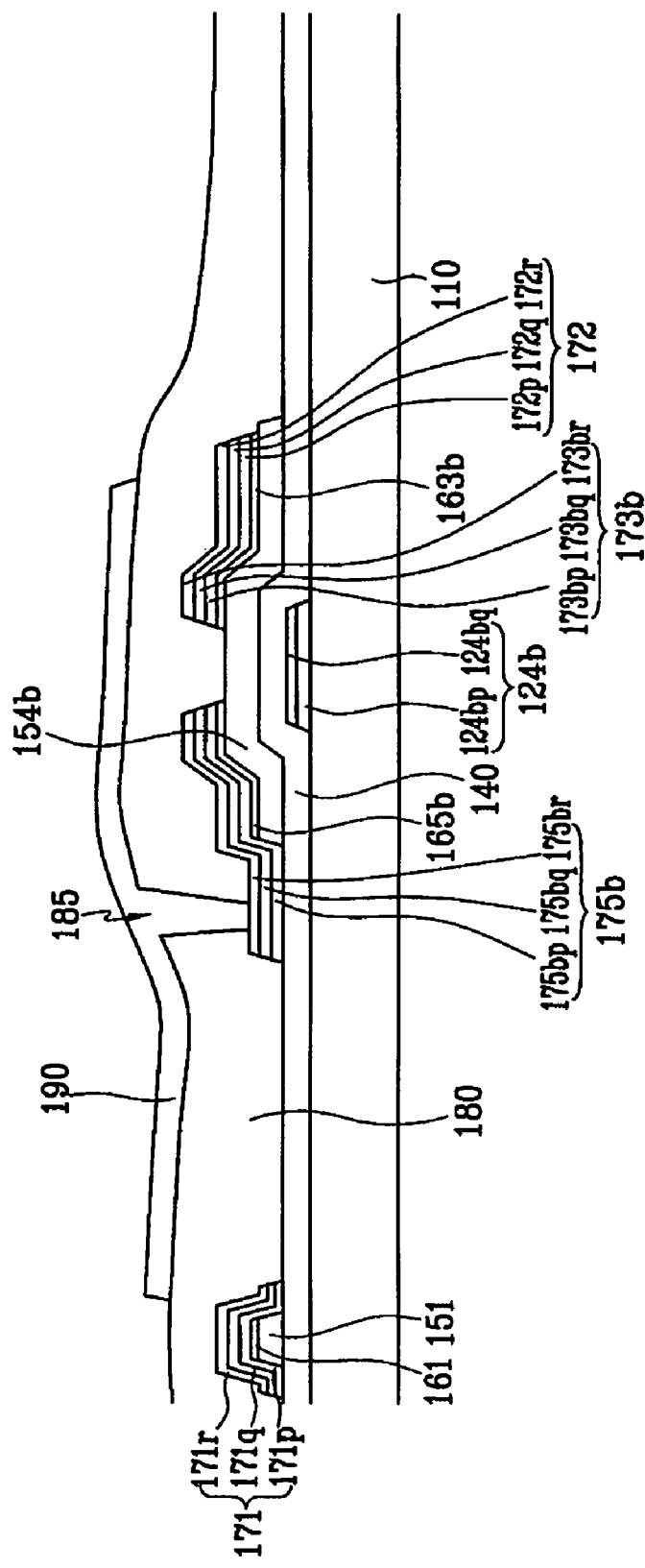
Figure 23:
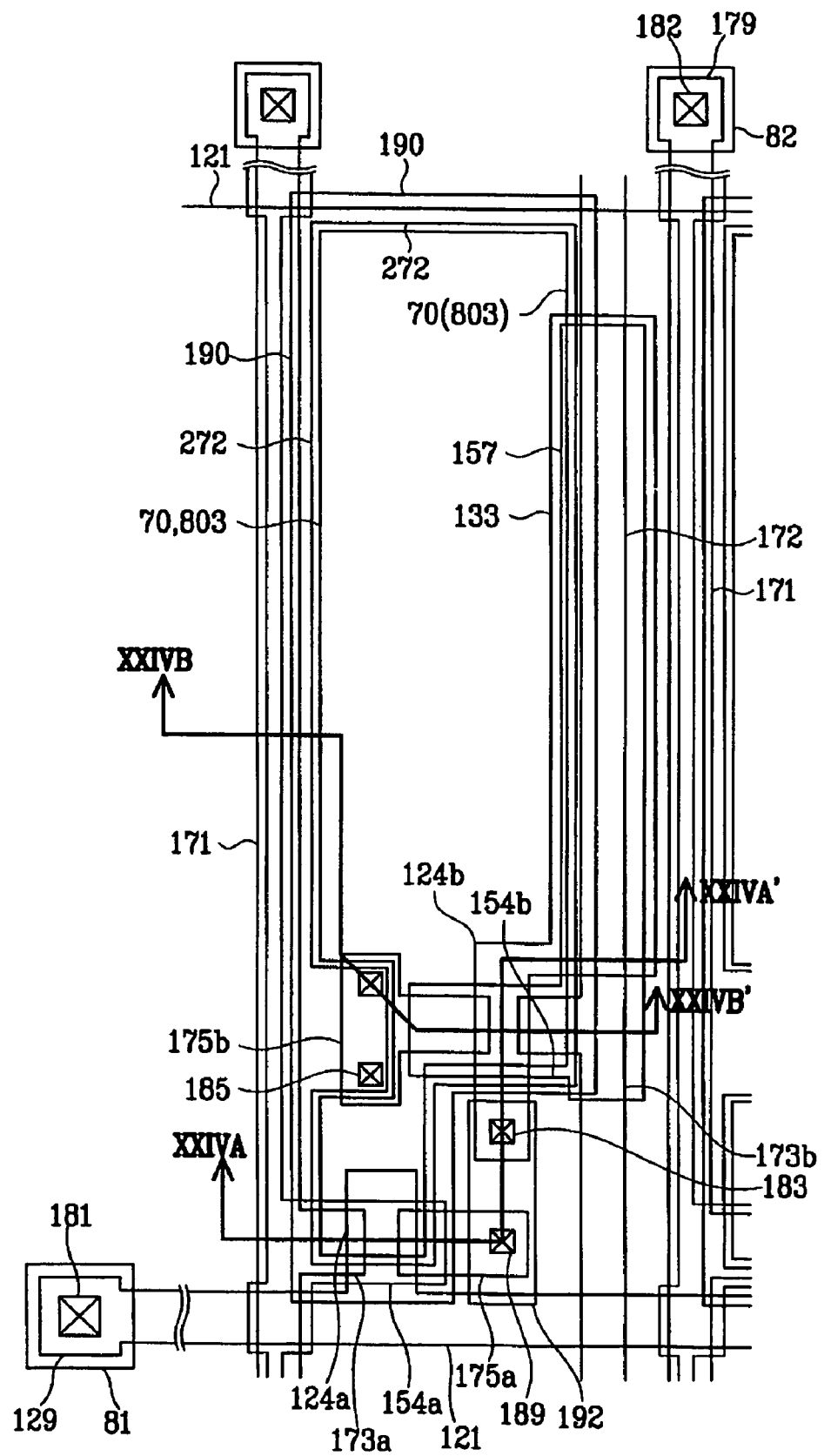
Figure 24A:
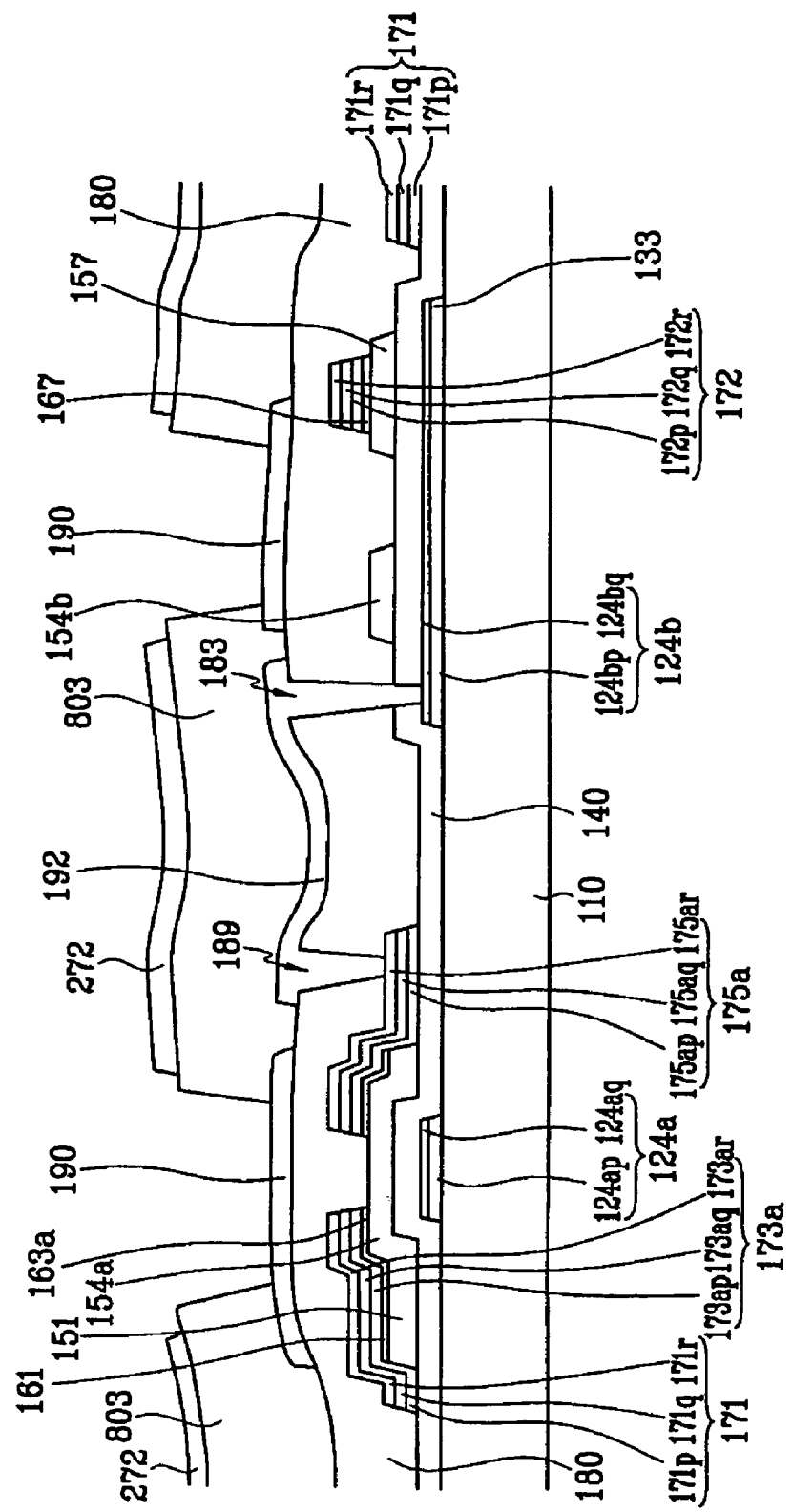
FIG. 24A and FIG. 24B are sectional views of the TFT array panel shown in FIG. 23 taken along the lines XXIVa-XXIVa' and XXIVb-XXIVb', respectively.
Figure 24B:
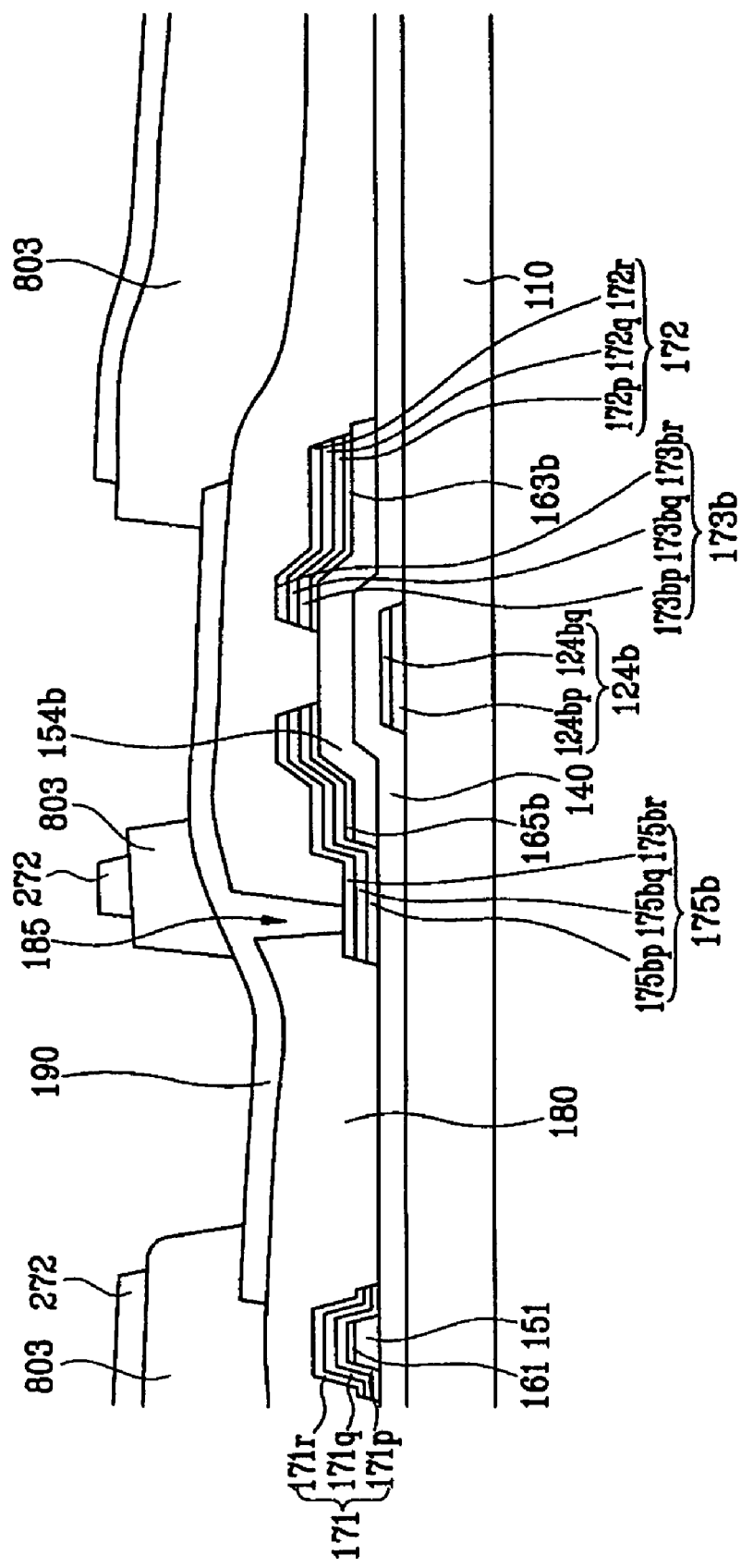
Figure 25:
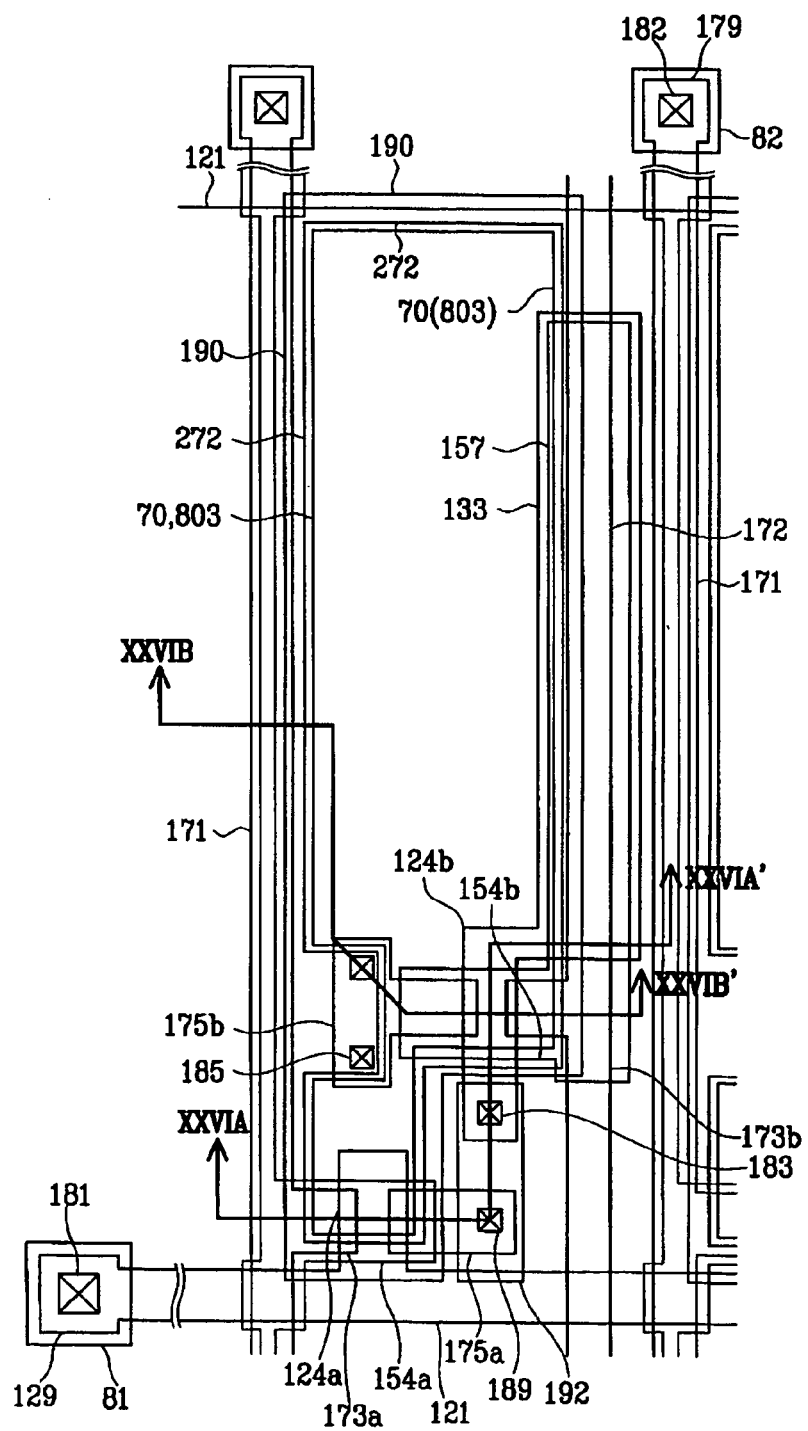
Figure 26A:
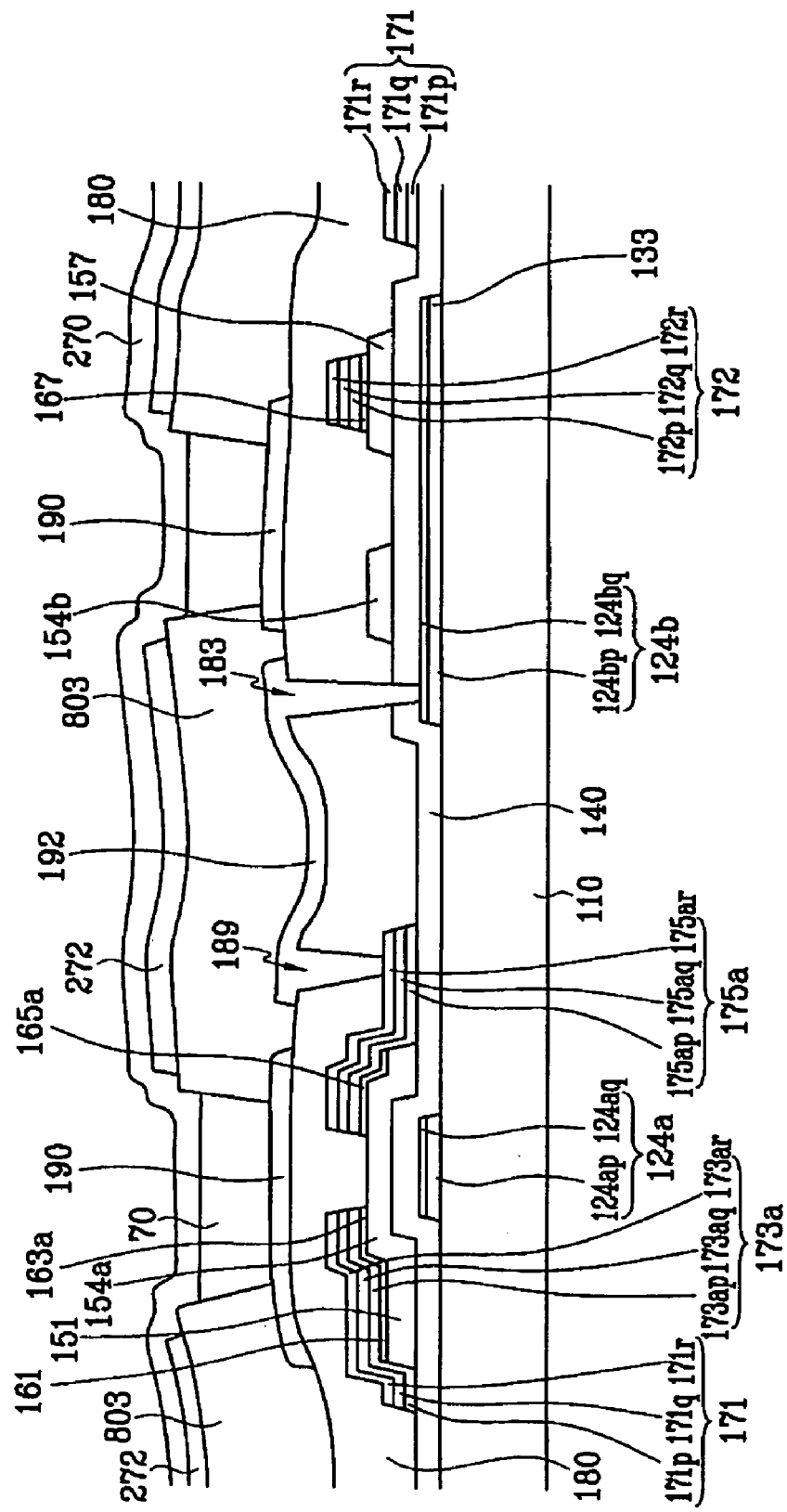
FIG. 26A and FIG. 26B are sectional views of the TFT array panel shown in FIG. 25 taken along the lines XXVIa-XXVIa' and XXVIb-XXVIb', respectively.
Figure 26B:
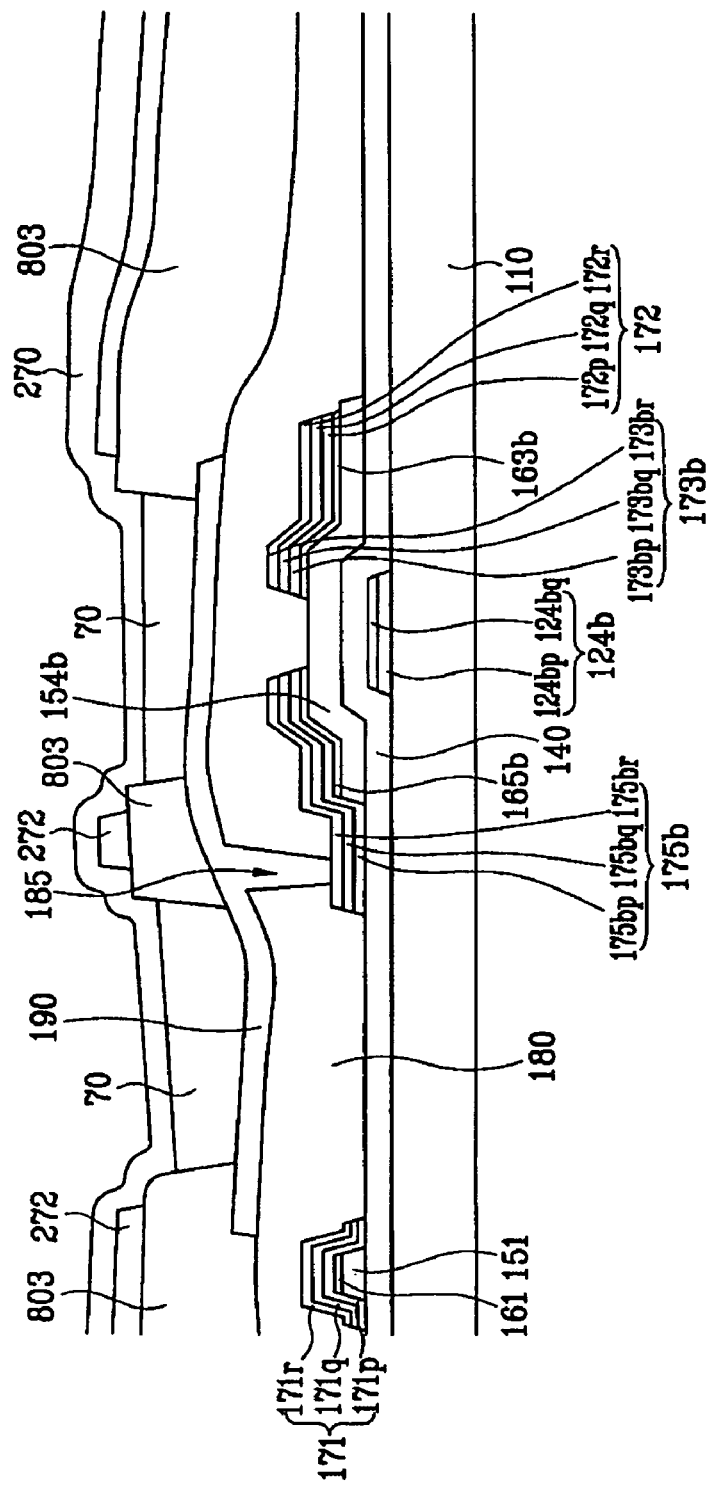

Referring to FIG. 21 through FIG. 22B, a plurality of pixel electrodes 190, a plurality of connecting members 192, and contact assistants 81 and 82 may be formed on passivation layer 180 with ITO or IZO.

The ITO layer is etched with the same etchant and etching condition as those used in forming the gate lines and the data lines, which is preferably the etchant of embodiment 2.

Pixel electrodes 190 have side slopes of an angle between approximately 40 degrees and 50 degrees and have CD skew from about 0.2 μm to 0.3 μm.

Referring to FIG. 23 through FIG. 26B, a partition 803 and an auxiliary electrode 272 can be formed using only a single photolithography step.

Figure 11:
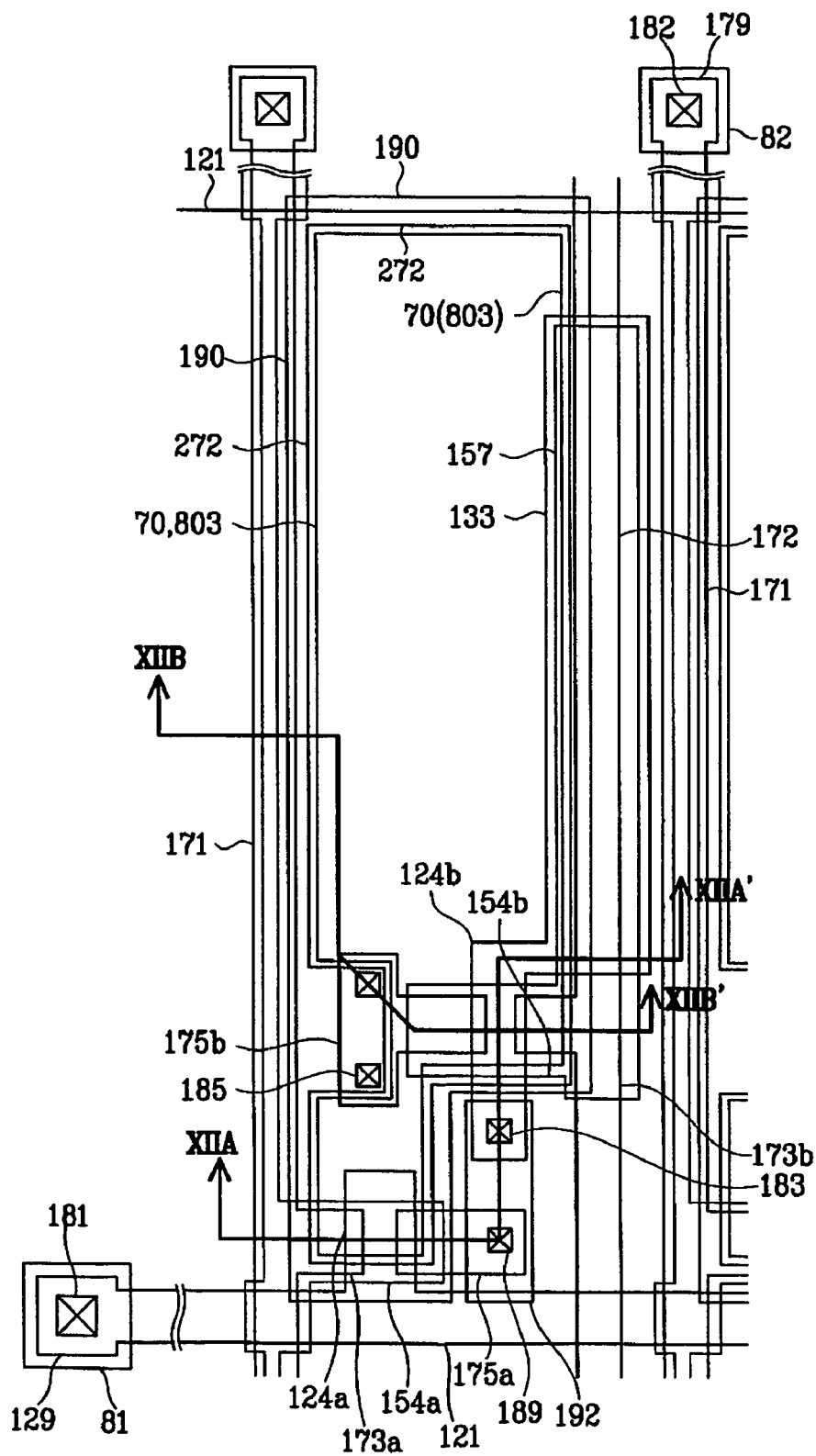
FIG. 11 is a layout view of a TFT array panel for an OLED according to yet another embodiment of the present invention.
Figure 12B:
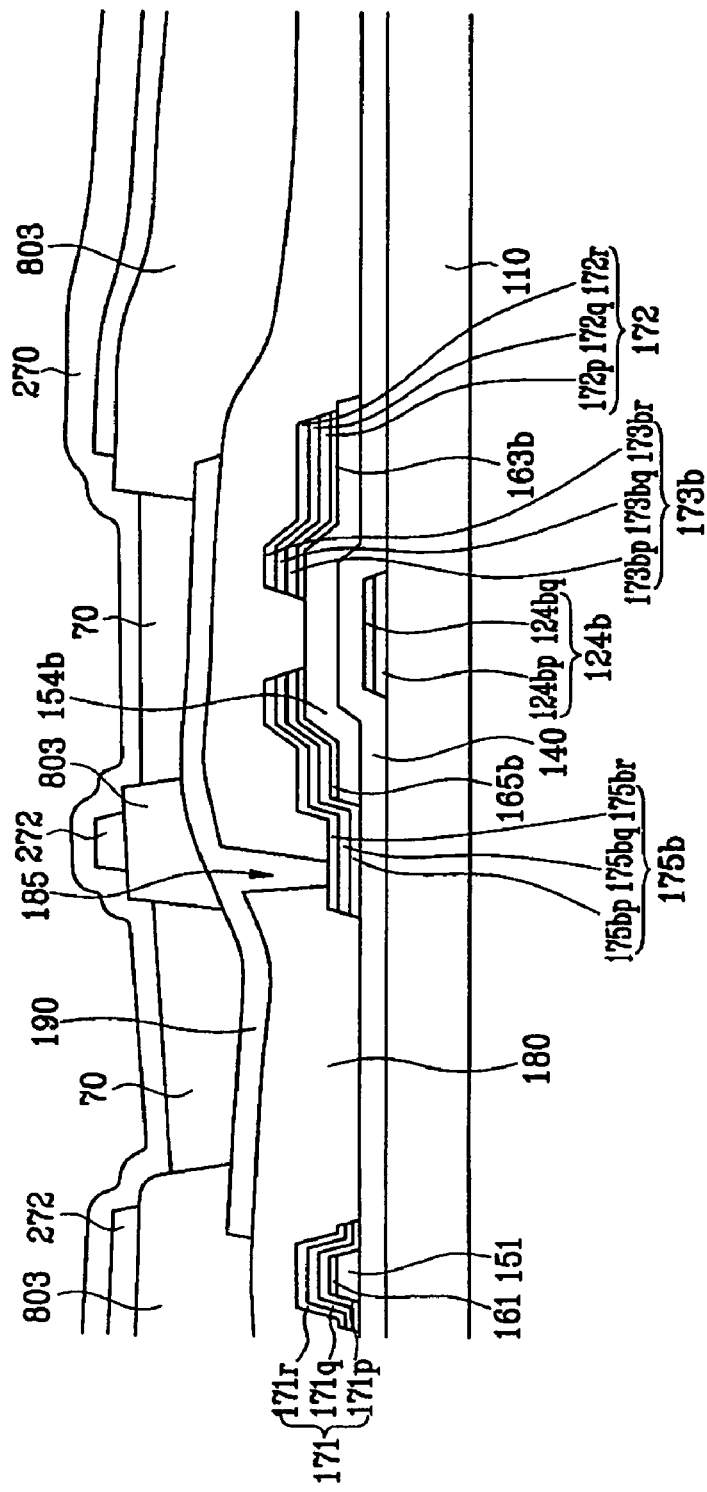

Finally, a plurality of organic light emitting members 70, preferably comprising multiple layers, are formed in the openings by deposition or inkjet printing following a masking, and common electrode 270 is subsequently formed as shown in FIG. 11 through FIG. 12B.

Because gate lines 121, data lines 171, drain electrodes 175a and 175b, voltage transmission lines 172, and pixel electrodes 190 are patterned with the same etchant and etching conditions, the manufacturing process is simplified thereby saving costs. All conductive layers etched with an etchant according to the present invention have a good profile.

Although preferred embodiments of the present invention have been described above in detail, it should be clearly understood that many variations and/or modifications of the basic inventive concepts are taught herein, which may appear obvious to those skilled in the present art, will still fall within the spirit and scope of the present invention, as defined in the appended claims.

What is claimed is:

1. An etchant for conductive materials, comprising:
    about 65 wt % to about 75 wt % of phosphoric acid;
    about 0.5 wt % to about 15 wt % of nitric acid;
    about 2 wt % to about 15 wt % of acetic acid;
    about 0.1 wt % to about 8.0 wt % of a potassium compound; and
    deionized water.

2. The etchant for conductive materials of claim 1, wherein the potassium compound contains at least potassium nitrate ($KNO_3$) or potassium acetate ($KC_2H_3O_2$).

3. The etchant for conductive materials of claim 1, further comprising a basic nitrogen compound.

4. The etchant for conductive materials of claim 3, wherein the basic nitrogen compound contains at least ammonium hydrogen sulfide ($NH_4HS$) or 2,6-pyridine demethanol ($C_7H_9NO_2$).

5. The etchant for conductive materials of claim 3, wherein the amount of the basic nitrogen compound is between about 0.1 wt % to about 8.0 wt %.

6. An etchant for conductive materials comprising:
    about 65 wt % to about 75 wt % of phosphoric acid;
    about 0.5 wt % to about 15 wt % of nitric acid;
    about 2 wt % to about 15 wt % of acetic acid;
    about 0.1 wt % to about 8.0 wt % of a potassium compound including potassium nitrate ($KNO_3$) and potassium acetate ($KC_2H_3O_2$); and
    deionized water.

7. The etchant for conductive materials of claim 6, further comprising a basic nitrogen compound containing at least ammonium hydrogen sulfide ($NH_4HS$) or 2,6-pyridine demethanol ($C_7H_9NO_2$).

8. A method for manufacturing a thin film transistor array panel, comprising:
    forming a gate line having a gate electrode on an insulating substrate;

depositing in sequence a gate insulating layer, and a semiconductor layer on the gate line;

forming a drain electrode on the gate insulating layer and the semiconductor layer;

forming a data line having a source electrode on the gate insulating layer and the semiconductor layer such that a gap is disposed between the drain electrode and the source electrode; and forming a pixel electrode connected to the drain electrode, wherein at least one of the gate line, the data line, the drain electrode, and the pixel electrode is formed by photo-etching using an etchant comprising about 65 wt % to about 75 wt % of phosphoric acid, about 0.5 wt % to about 15 wt % of nitric acid, about 2 wt % to about 15 wt % of acetic acid, about 0.1 wt % to about 8.0 wt % of a potassium compound, and deionized water.

9. The method of claim 8, wherein the potassium compound contains at least potassium nitrate ($KNO_3$) or potassium acetate ($KC_2H_3O_2$).

10. The method of claim 8, wherein the formation of the pixel electrode comprises: depositing an indium tin oxide (ITO) layer or an indium zinc oxide (IZO) layer; and photo-etching the ITO or IZO layer.

11. The method of claim 8, wherein the steps of forming a gate line, forming a data line and drain electrode, and forming a pixel electrode include a photo-etching using the etchant comprising about 65 wt % to about 75 wt % of phosphoric acid, about 0.5 wt % to about 15 wt % of nitric acid, about 2 wt % to about 15 wt % of acetic acid, about 0.1 wt % to about 8.0 wt % of a basic nitrogen compound, and deionized water.

12. The method of claim 8, wherein the photo-etching is performed at a temperature between about 30° C. and about 45° C.

13. The method of claim 8, further comprising about 0.1 wt % to about 8.0 wt % of a basic nitrogen compound.

14. The method of claim 13, wherein the basic nitrogen compound contains at least ammonium hydrogen sulfide ($NH_4HS$) or 2,6-pyridine demethanol ($C_7H_9NO_2$).

15. The method of claim 8, wherein the step of forming the gate line comprises:

depositing a first metal layer including Al and a second metal layer including Mo; and photo-etching the first metal layer and the second metal layer.

16. The method of claim 15, wherein the first metal layer includes Al—Nd.

17. The method of claim 15, wherein the second metal layer includes Mo—Nb and MoN.

18. The method of claim 8, wherein the steps of forming the data line and drain electrode comprises:

depositing in sequence a first metal layer including Mo, a second metal layer including Al, and a third metal layer including Mo; and photo-etching the first metal layer, the second metal layers, and the third metal layer.

19. The method of claim 18, wherein the first and third metal layers include Mo—Nb and MoN.

20. The method of claim 18, wherein the second metal layer includes an Al-alloy comprising Al—Nd.

21. The method of claim 8, wherein the photo-etching comprises applying the etchant on a plurality of conductive layers to form the gate line, the data line, the drain electrode, and the pixel electrode for about 30 seconds to about 200 seconds.

22. The method of claim 21, wherein the etchant is applied on the conductive layers that form the gate line, the data line, the drain electrode, and the pixel electrode by spraying the etchant on the conductive layers.

* * * * *